United States Patent [19]

Powers et al.

[11] Patent Number: 5,193,690

[45] Date of Patent: Mar. 16, 1993

[54] METHOD OF AND APPARATUS FOR AUTOMATICALLY INSPECTING AN EXPOSED AND BENT LITHOGRAPHIC PLATE

[75] Inventors: John W. Powers, Battlefield; Daniel G. Choate, Everton; Kelly T. McMasters, Springfield, all of Mo.

[73] Assignee: Western Litho Plate & Supply Co., St. Louis, Mo.

[21] Appl. No.: 711,655

[22] Filed: Jun. 6, 1991

[51] Int. Cl.[5] .............................................. B07C 5/00
[52] U.S. Cl. .................................... 209/558; 209/556; 209/939; 101/463.1
[58] Field of Search .................. 209/55, 556, 558, 939, 209/576, 587, 540; 101/463.1, 481; 430/22, 302, 309

[56] References Cited

U.S. PATENT DOCUMENTS

| | | | |
|---|---|---|---|
| 4,179,990 | 12/1979 | Radencil | 430/22 X |
| 4,297,676 | 10/1981 | Moriya et al. | 340/146 |
| 4,380,026 | 4/1983 | Kubota | 358/106 |
| 4,396,901 | 8/1983 | Saitou et al. | 382/8 |
| 4,424,589 | 1/1984 | Thomas et al. | 382/61 |
| 4,472,736 | 9/1984 | Ushio et al. | 358/75 |
| 4,546,700 | 10/1985 | Kishner et al. | 101/211 |
| 4,573,190 | 2/1986 | Tsunoda et al. | 382/1 |
| 4,582,768 | 4/1986 | Takeuchi et al. | 430/22 |
| 4,599,122 | 7/1986 | Makamura | 156/64 |
| 4,610,359 | 9/1986 | Muller | 209/939 X |
| 4,618,938 | 10/1986 | Sandland et al. | 364/552 |
| 4,649,566 | 3/1987 | Tsunoda et al. | 382/1 |
| 4,697,245 | 9/1987 | Kara et al. | 364/552 |
| 4,758,888 | 7/1988 | Lapidot | 358/106 |
| 4,763,359 | 8/1988 | Tsunoda et al. | 382/1 |
| 4,771,468 | 9/1988 | Batchelder et al. | 382/8 |
| 4,792,049 | 12/1988 | Janoick et al. | 209/556 |
| 4,883,359 | 11/1989 | Ina et al. | 430/22 X |
| 4,926,999 | 5/1990 | Fauth, Sr. et al. | 198/358 |
| 4,947,666 | 8/1990 | Hametner et al. | 72/37 |
| 5,058,500 | 10/1991 | Mizuno | 101/463.1 X |

FOREIGN PATENT DOCUMENTS

| | | | |
|---|---|---|---|
| 3515188 | 10/1986 | Fed. Rep. of Germany | 209/558 |
| 2651696 | 3/1991 | France | 209/556 |
| 0132333 | 6/1987 | Japan | 209/939 |

OTHER PUBLICATIONS 8-page brochure entitled "Automated Systems" published in 1989 by Western Lithoplate and Supply Co. (see pp. 6 and 7 particularly).

Undated 3-page brochure entitled "Scanning Systems" published by Harland Simon Scanning Systems.

Primary Examiner—Robert P. Olszewski
Assistant Examiner—James R. Bidwell
Attorney, Agent, or Firm—Senniger, Powers, Leavitt & Roedel

[57] ABSTRACT

A method of automatically inspecting an exposed and bent lithographic plate having an image thereon to determine whether the image is in proper registration relative to the plate. The plate has front, rear, and opposite side edges. The method comprises the steps of automatically conveying a lithographic plate from bending apparatus to an inspection station, the plate having been bent by the bending apparatus to form flanges along the front and rear edges of the plate to enable mounting of the plate on a press, moving the lithographic plate into a fixed reference position at the inspection station and holding the plate in that position, automatically inspecting the plate when it is in its fixed reference position to determine whether the image is in proper registration relative to the plate, and automatically conveying the plate from the inspection station to a first destination if the image is not in proper registration relative to the plate and to a second destination of the image is in proper registration relative to the plate. Apparatus for carrying out this method is also disclosed.

29 Claims, 14 Drawing Sheets

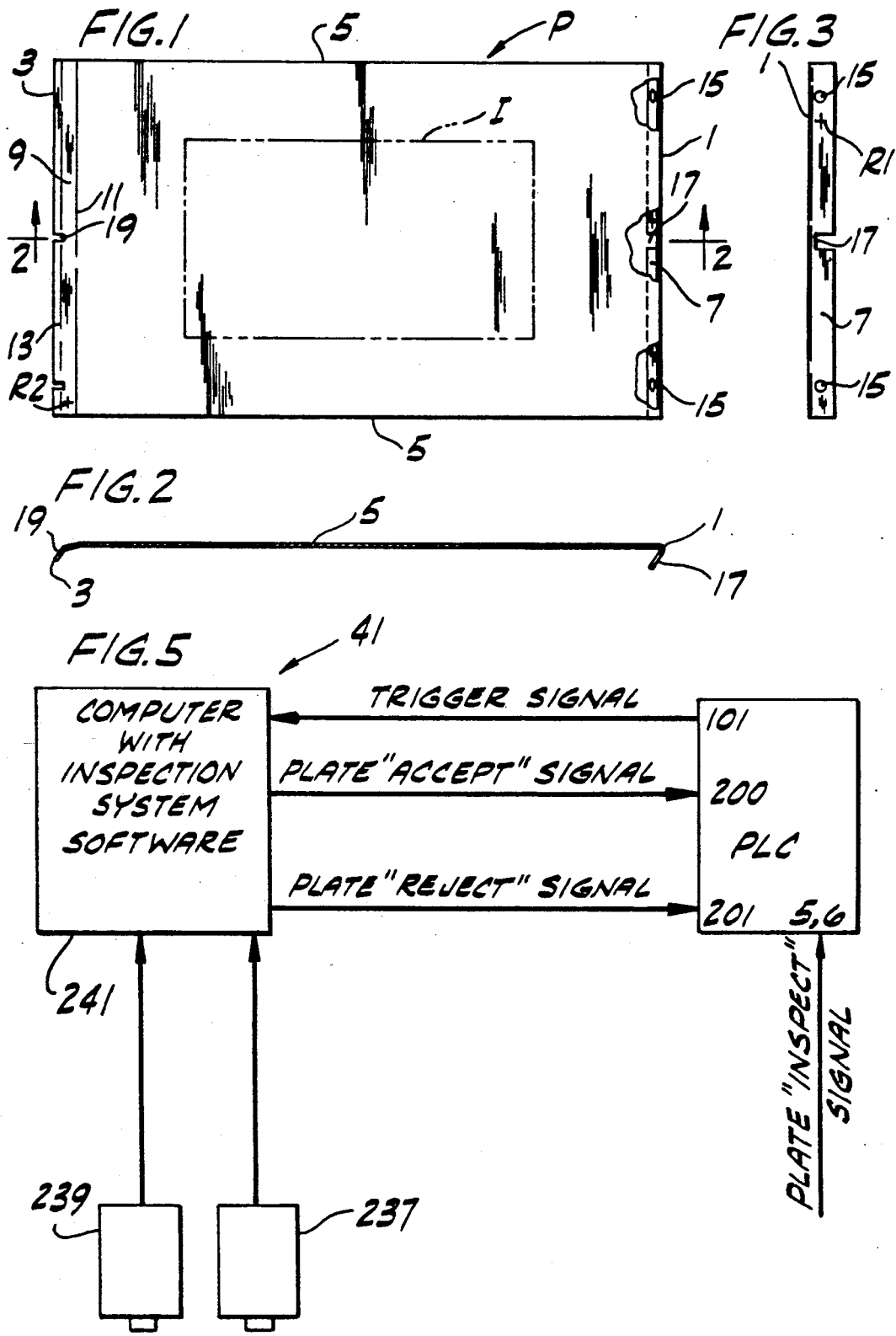

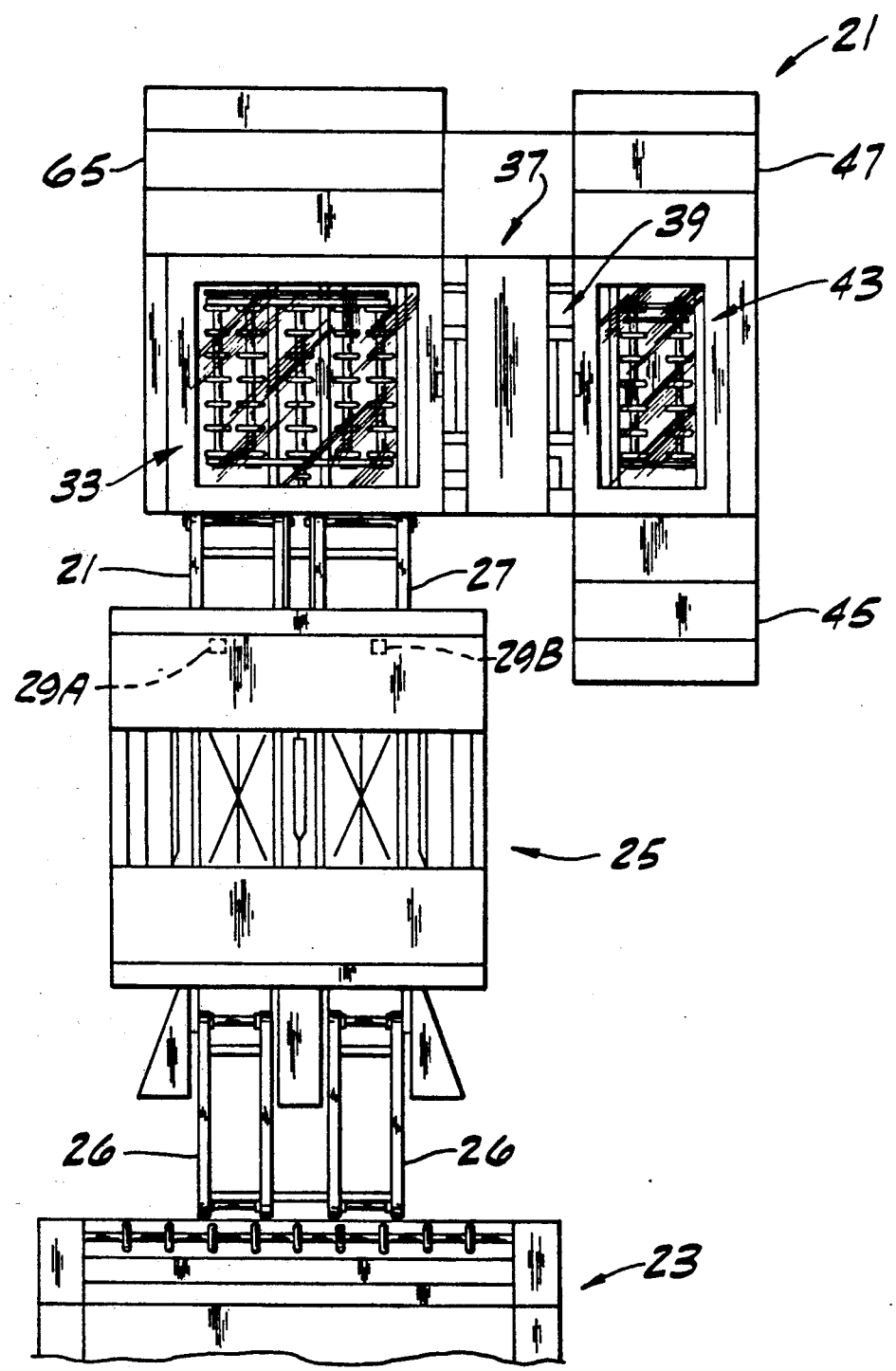

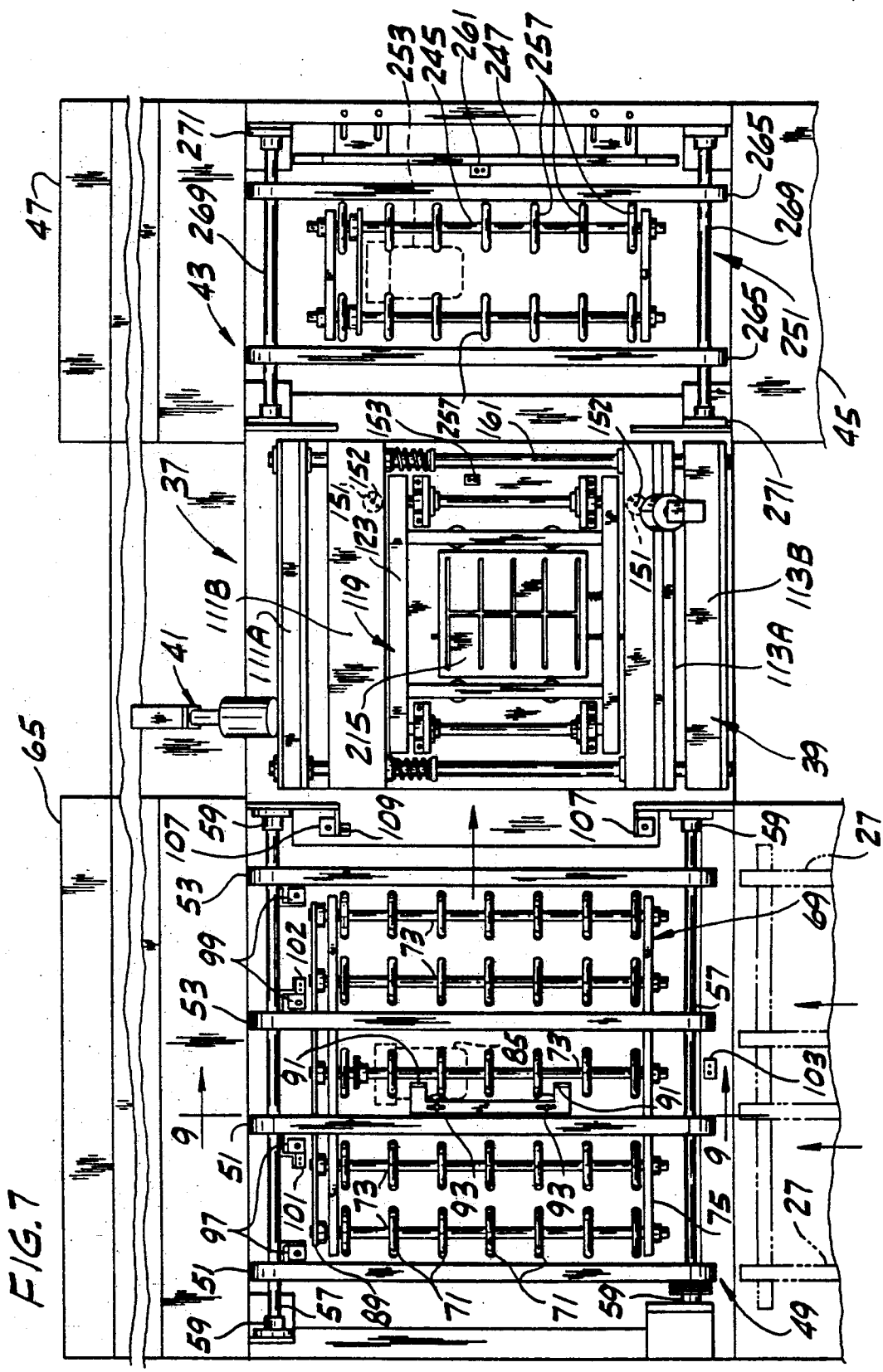

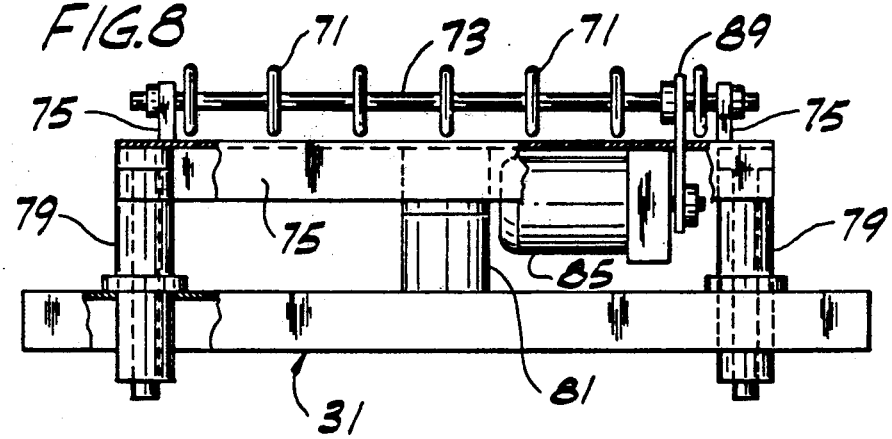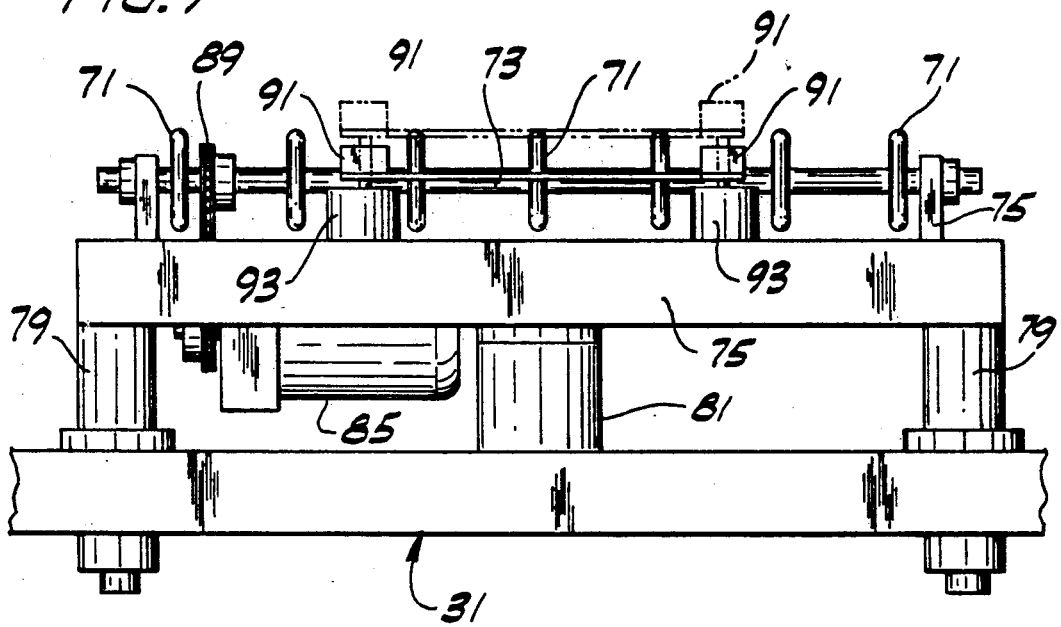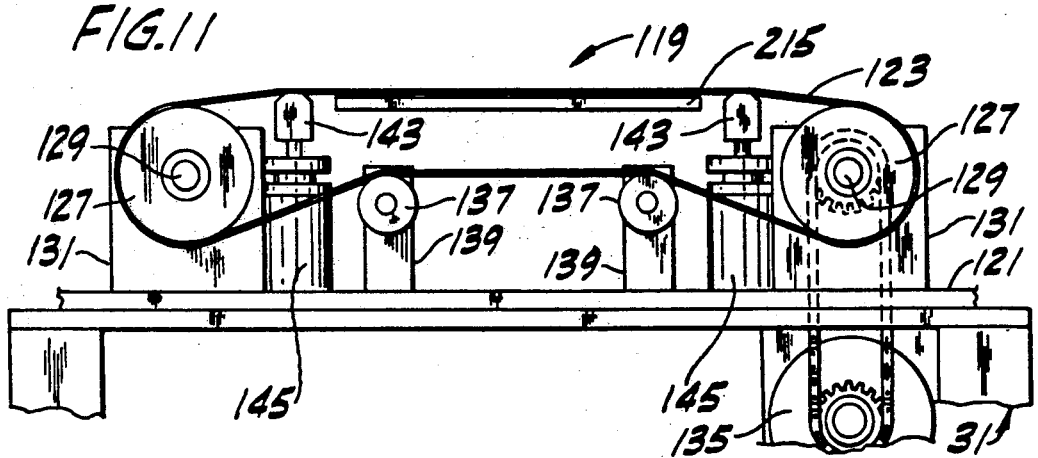

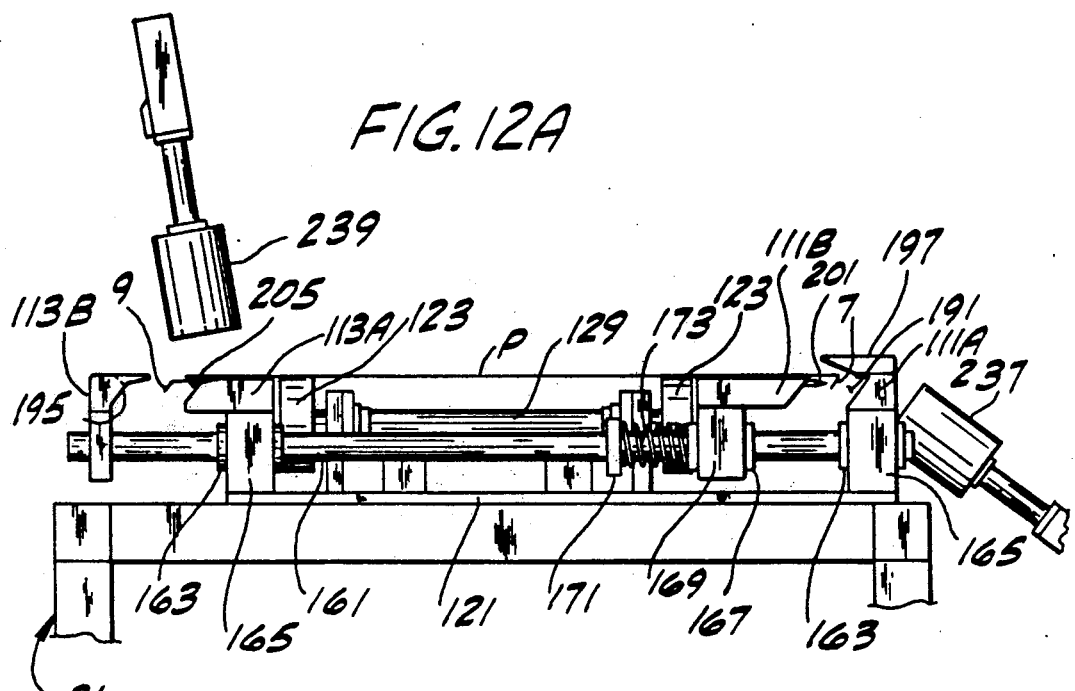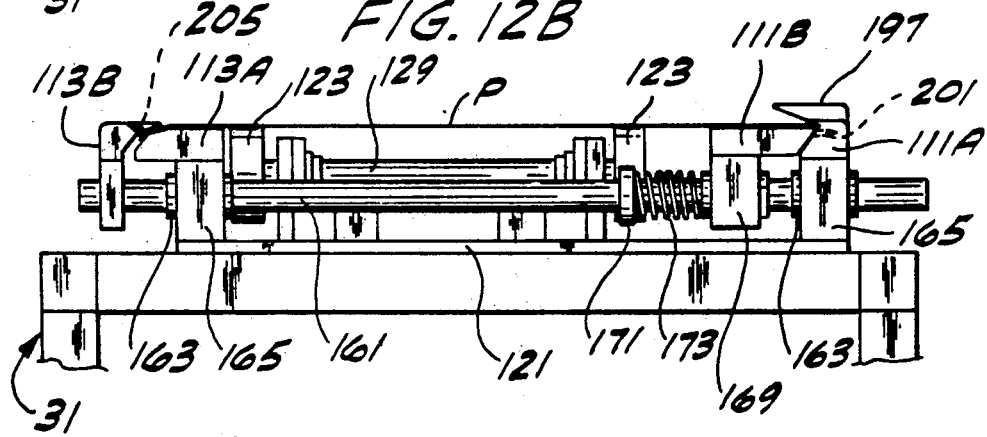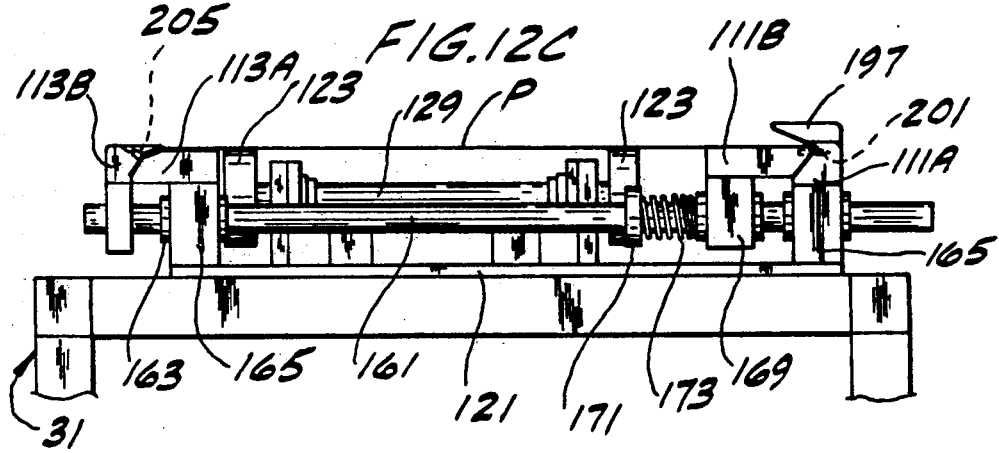

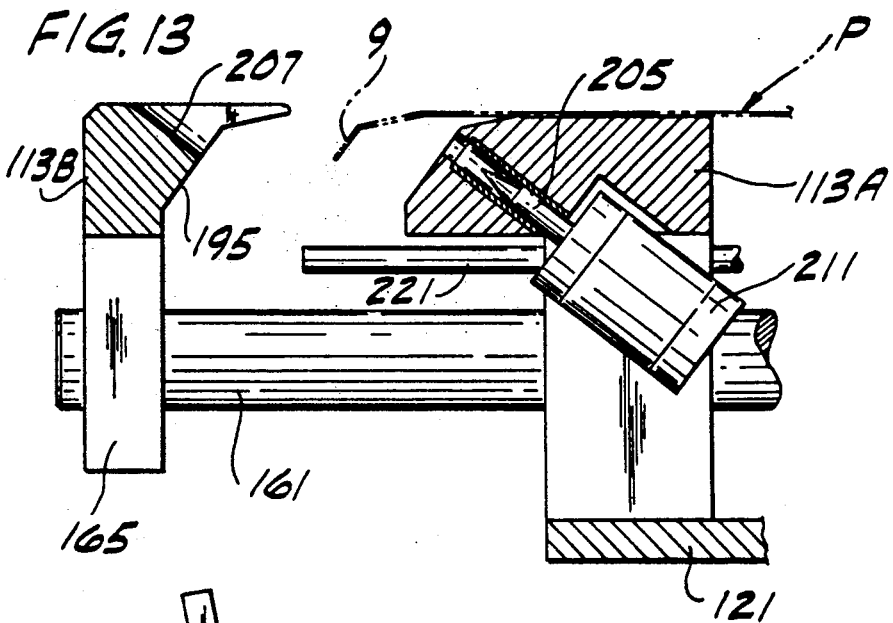
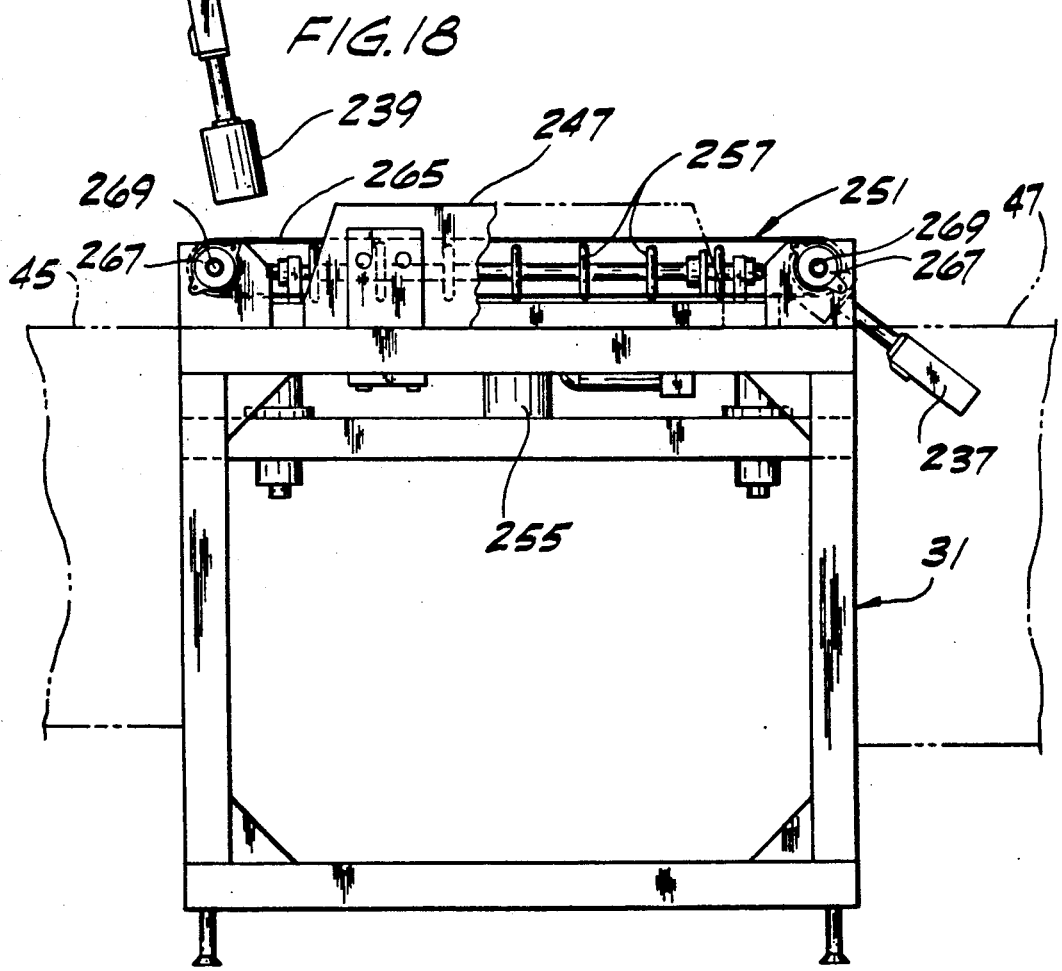

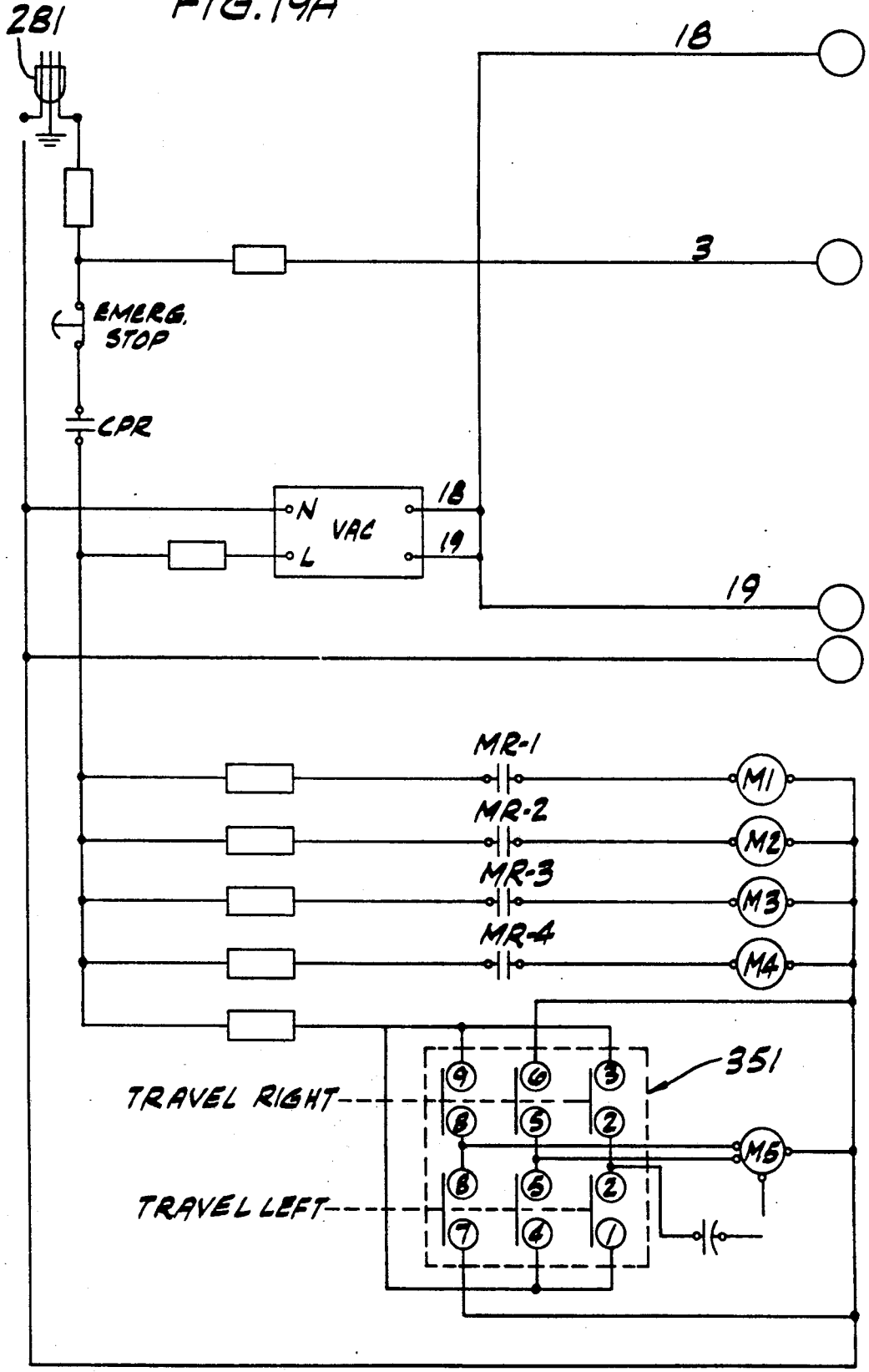

METHOD OF AND APPARATUS FOR AUTOMATICALLY INSPECTING AN EXPOSED AND BENT LITHOGRAPHIC PLATE

BACKGROUND OF THE INVENTION

This invention relates generally to the processing of lithographic plates and, more particularly, to method and apparatus for automatically inspecting a lithographic plate after it has been exposed and bent to determine whether an image on the plate is in proper registration with respect to the plate.

In printing a lithographic color image on newspaper stock, for example, stock is fed through successive rolls of a press. One or more lithographic plates are mounted on each roll for printing a single color of the image on the stock, with different color plates on successive rolls adding different colors to the image. To produce a clear final image, it is essential that precise registration of the images be achieved; otherwise the superimposed printed color images on the stock will be out of registration. Obtaining such registration is difficult. Not only must the image be precisely applied to the plate during the exposure process, but the exposed plate must be precisely bent to form the flanges required for mounting the plate on the press. Over the years plates have been checked for proper image registration in various ways, but these have proven to be less than entirely satisfactory, either because the inspection has occurred prior to the time the plate is in final form (e.g., prior to the bending step), thus making a final check of registration impossible, or because the inspection has involved manual steps, such as manually conveying a plate after it has been bent to an inspection station where it is inspected, and then manually removing the plate from the inspection station, all of which greatly increases the time and labor required before the plate is ready for application to a press.

SUMMARY OF THE INVENTION

Among the several objects of this invention may be noted the provision of an improved method and apparatus for automating the inspection of a color lithographic plate to determine image registration; the provision of such method and apparatus which eliminates manual handling of a plate as it proceeds from a bending station to an inspection station, and thereafter to a final destination; the provision of such method and apparatus which checks for registration within selected tolerances which may be adjusted according to need; the provision of such method and apparatus which automatically handles single-wide color plates, black and white plates and double-wide plates conveyed from a bender, and which automatically inspects only color plates (e.g., single-wide color plates) while passing other plates through without inspection to a final destination (e.g., a storage bin); the provision of such method and apparatus wherein each color plate is held in a fixed reference position for inspection by jaws which match the configuration of the press on which the plate is to be mounted, thereby ensuring that a plate which passes inspection will have the desired results when it is actually mounted on the press; the provision of such method and apparatus which automatically sorts plates found to be in proper registration from plates found not to be in proper registration; the provision of such method and apparatus wherein an operator is notified when a plate is found not to be in proper registration; and the provision of such method and apparatus which greatly reduces the time and labor involved in the inspection process.

In general, a method of this invention involves the automatic inspection of an exposed and bent lithographic plate having an image thereon for the purpose of determining whether the image is in proper registration relative to the Plate. The plate has front, rear, and opposite side edges. The method comprises the steps of (a) automatically conveying a lithographic Plate from bending apparatus to an inspection station, the plate having been bent by the bending apparatus to form flanges along the front and rear edges of the plate to enable mounting of the plate on a Press, (b) moving the lithographic plate into a fixed reference position at the inspection station and holding the plate in said Position, (c) automatically inspecting the plate when it is in said fixed reference position to determine whether the image is in proper registration relative to the plate, and (d) automatically conveying the plate from the inspection station to a first destination if the image is not in Proper registration relative to the plate and to a second destination of the image is in proper registration relative to the plate.

Apparatus of this invention comprises first conveyor means for automatically conveying a lithographic plate from bending apparatus to an inspection station, the plate having been bent by the bending apparatus to form flanges along the front and rear edges of the plate to enable mounting of the plate on a press. Positioning means at the inspection station moves the lithographic plate into a fixed reference position and holds the plate in said position. Inspection means is provided for automatically inspecting the plate when it is in said fixed reference position thereby to determine whether the image is in proper registratior relative to the plate. Second conveyor means automatically conveys the plate from the inspection station to a first destination if the image is not in proper registration relative to the plate and to a second destination of the image is in proper registration relative to the plate.

Other objects and features will be in part apparent and in part pointed out hereinafter.

BRIEF DESCRIPTION OF THE DRAWINGS

FIG. 1 is a plan of a lithographic plate bearing registration marks for use in the inspection apparatus of this invention;

FIG. 2 is a side elevation of the plate of FIG. 1;

FIG. 3 is a right end elevation of the plate of FIG. 1;

FIG. 4 is a plan of a plate processing line including apparatus, bending apparatus and inspection apparatus of this invention;

FIG. 5 is a diagrammatic view of an inspection system and programmable controller of the inspection apparatus;

FIG. 7 is a top plan of the inspection apparatus;

FIG. 8 is a left end elevation of FIG. 7;

FIG. 9 is an enlarged section on line 9—9 of FIG. 7;

FIG. 11 is a side elevation of an inspection belt conveyor;

FIGS. 12A–12C are views illustrating the operation of two pairs of jaws to position a plate in a fixed reference position at the inspection station;

FIG. 13 is an enlarged section view showing a retractible registration pin associated with one pair of jaws;

FIG. 18 is a right end elevation of FIG. 7; and

FIGS. 19A-19C is an electrical circuit for the apparatus.

Corresponding parts are designated by corresponding reference numerals throughout the several views of the drawings.

DETAILED DESCRIPTION OF THE PREFERRED EMBODIMENT

Figure 6:
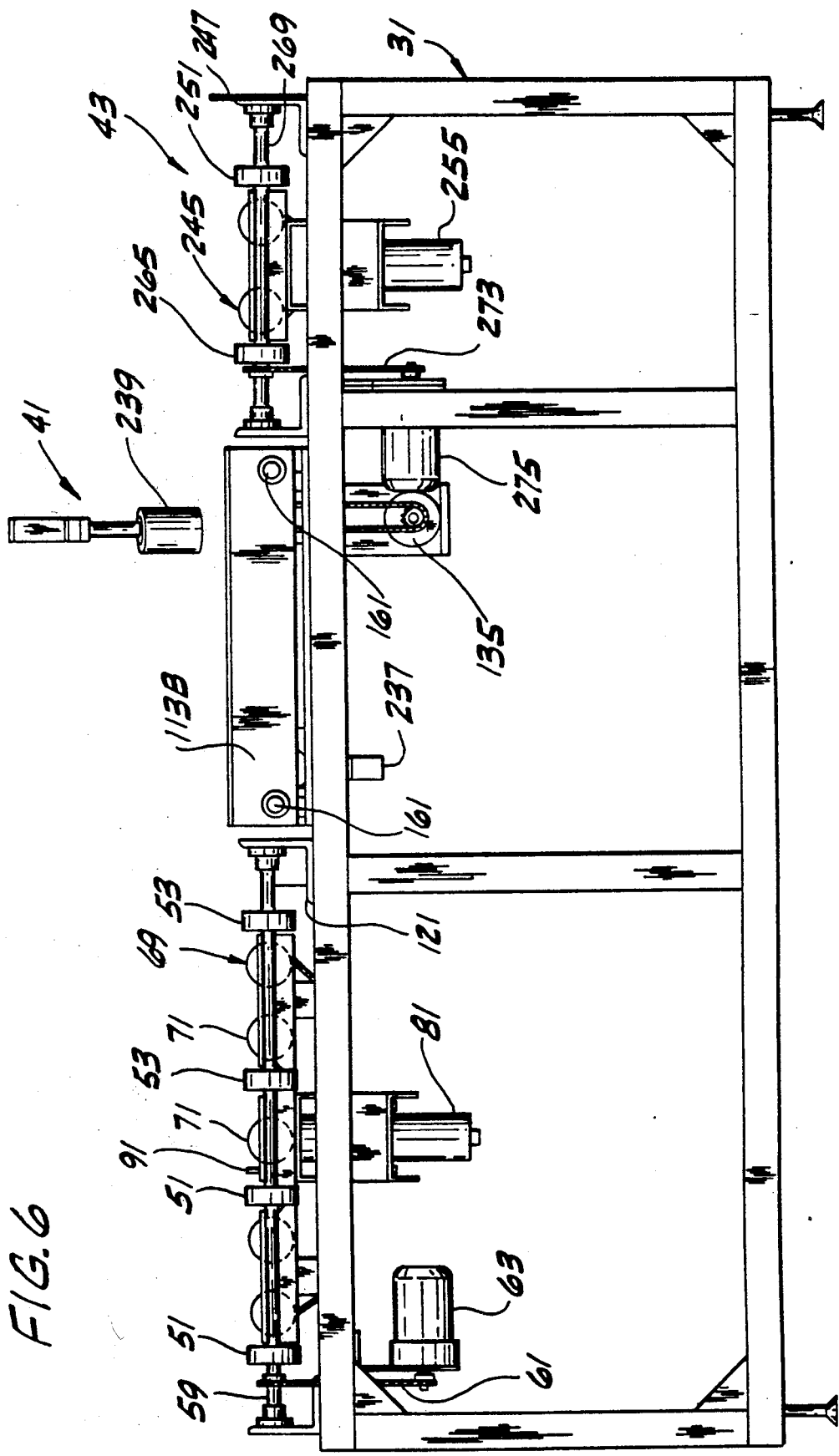
FIG. 6 is a side elevation of the inspection apparatus of FIG. 4.

Referring now to the drawings, a conventional lithographic plate P is shown in FIGS. 1-3 as having front and rear edges designated 1 and 3, respectively, and opposite side edges, each designated 5. A front flange 7, sometimes referred to as the "leading edge flange", is bent sharply downwardly and rearwardly from the front edge of the plate, and a rear flange 9, sometimes referred to as the "trailing edge flange", is bent downwardly and rearwardly along two spaced bend lines 11, 13 extending transversely of the plate. The front flange 7 has two registration holes 15 in it generally adjacent opposite sides of the plate for use in mounting the plate in fixed position during the exposure process, and a single opening in the form of a notch 17 centrally located between the ends of the flange for use in mounting the plate at the inspection station, as will appear, and later on a press. The rear flange 9 has a similar central opening or notch 19 therein used for the same purpose as notch 17. It will be understood that the specific configuration of the front and rear flanges 7, 9, and the number and location of the registration holes 15 and notches 17, 19, may vary without departing from the scope of this invention.

Referring now to FIG. 4, apparatus of this invention for automatically inspecting a lithographic plate P is designated in its entirety by the reference numeral 21. Also shown is conventional exposing apparatus 23 and bending apparatus 25. Typically, lithographic plates are first punched by suitable punching apparatus (not shown) to form the appropriate registration holes 15 and notches 17, 19. The plates are then transferred to exposing apparatus (not shown) where each plate P is exposed through a film having an image I thereon, thereby transferring the image to the plate. This image may be a black and white image or a color image, and the plate may either be a single-wide plate or a double-wide plate. Also important to note is that the image I on the plate may include one or more registration marks (e.g., R1 and R2 in FIGS. 1 and 3), on or adjacent the front and/or rear flanges 7, 9, for use by the inspecting apparatus 21 in checking the accuracy of the registration of the image on the plate, as will appear. These registration marks appear only on color plates; they do not appear on black and white plates. In any case, each exposed plate is conveyed from the exposing apparatus to apparatus (e.g., 23) for processing the plate, and then by endless conveyors 26 to suitable bending apparatus (e.g., 25) where the plate is bent to form the front and rear flanges 7, 9. After the bending process, plates are conveyed to the inspection apparatus 21 via endless belt conveyors 27 capable of conveying two single-wide plates side-by-side, or one double-wide plate, the plates proceeding with their sides 5 generally parallel to the direction of plate travel.

It may not be necessary to inspect each plate P arriving at the inspection station 21 for image registration. For example, if single-wide black and white plates, single-wide color plates and double-wide plates are being processed in the same batch, it may be necessary to inspect only single-wide color plates for image registration. Under these circumstances, steps must be taken prior to a plate arriving at the inspection apparatus, or immediately thereafter, to identify those plates requiring inspection so that those which do not may be allowed to pass through without inspection. This can be done in any number of different ways. For example, each plate may be scanned for an appropriate inspection mark (e.g., R1 and R2) by photosensors 29A, 29B in the bending apparatus 25, or by scanning equipment between the exposing and bending apparatus (e.g., such as scanning equipment sold by Harland Simon Scanning Systems, Ltd., Smith House, Bond Ave, Milton Keynes, MKI 1UH, England, under the trademark "Parascan", model 800), or by a suitable sensor located on or immediately adjacent the inspection apparatus 21. In any event, if a plate is to be inspected, a suitable "inspect" signal is generated and supplied to a programmable logic controller PLC (FIG. 5) controlling the operation of the inspection apparatus in the manner described herein.

Inspection apparatus 21 comprises a frame, generally designated 31, entry (first) conveyor means generally designated 33 on the frame for automatically conveying color lithographic plates P from the conveyors 27 from the bending apparatus to an inspection station 37, positioning means generally designated 39 at the inspection station for moving a color lithographic plate into a fixed reference position and for holding the plate in that position, inspection means generally indicated at 41 for automatically inspecting the plate when it is in the stated reference position thereby to determine whether the image I on the plate is in proper registration relative to the plate, and exit (second) conveyor means generally designated 43 on the frame for automatically conveying a plate from the inspection station to a first destination (e.g., a "reject" bin 45) if the image is not in proper registration relative to the plate and to a second destination (e.g., an "accept" bin 47) if the image is in proper registration relative to the plate.

Entry conveyor means 33 comprises an entry conveyor 49 including two pairs of endless belts (a left pair of belts 51 and a right pair of belts 53 as viewed in FIG. 7). These belts are trained around pulleys on shafts 57 journalled in bearings 59 mounted on the frame 31. A drive chain 61 driven by a motor 63 rotates one of the shafts to drive all four belts (see FIG. 6). Each pair of belts 51, 53 is adapted for carrying one single-wide plate in an orientation in which the front and rear flanges 7, 9 of the plate extend generally at right angles relative to the direction of travel, and the two pairs of belts are spaced apart a distance sufficient to provide a gap between adjacent edges of two single-wide plates carried simultaneously side-by-side on the two pairs of belts. The two pairs of belts are also suited for carrying one double-wide plate, with the double-wide plate bridging the two pairs of belts. The entry conveyor 49 has an upstream end adjacent the endless belt conveyors 27 from the bending apparatus and a downstream end immediately adjacent a storage bin 65 attached to the frame 31, the arrangement being such that plates (i.e., black and white plates and double-wide plates) not conveyed to the inspection station 37 will fall from the conveyor 33 into the storage bin 65.

Entry conveyor means 33 further comprises an entry transfer conveyor 69 for conveying a color plate (or plates) to be inspected from the entry conveyor 49 to the inspection station 37. The transfer conveyor 69 is a roller conveyor comprising a series of rollers 71 mounted on parallel shafts 73 the ends of which are journalled in a conveyor subframe 75. This subframe 75 is vertically movable in guides 79 (FIG. 8) affixed to the main frame 31 by means of a pneumatic or hydraulic cylinder 81 between a lowered position in which the tops of the rollers 71 are disposed below the upper reaches of the endless belts 51, 53 of the entry conveyor (FIG. 6), and a raised position in which the tops of the rollers are disposed above the belts 51, 53 for conveying a plate (or plates) thereon sideways (in a direction generally at right angles to the direction of conveyance of the entry conveyor 49) to the inspection station 37. Cylinder 81 is under the control of programmable logic controller PLC to maintain the roller conveyor 69 in its normally lowered position. The rollers 71 are conjointly rotated by means of a motor 85 having a sprocket gear in mesh with a drive chain 89 trained around sprockets carried by the roller shafts 73. A restraining bar 91 is mounted on the conveyor subframe 75 in a position extending generally parallel to the roller shafts 73 and midway between the two pairs of endless infeed belts 51, 53. As shown best in FIG. 9, this restraining bar 91 is movable by cylinders 93 between a lowered, non-restraining position and a raised, restraining position in which the bar is disposed above the tops of the rollers 71. The function of this bar 91 will become apparent.

Two pairs of solenoid-operated stops 97, 99 (entry stop means) are mounted on the frame adjacent the downstream end of the left and right pairs of entry conveyor belts 51, 53, one stop adjacent each belt (see FIG. 7). Operation of these left and right pairs 97, 99 of entry conveyor stops is under the control of the controller PLC. If a plate (or plates) conveyed by the entry conveyor 49 is to be inspected, the solenoids of the appropriate pair of stops are energized to extend from a non-stopping position up to a stopping position in which they are engageable with the front flange 7 of the plate as it is conveyed forwardly, thereby stopping the plate before it falls into the storage bin 65. Photo-sensors 101, 102 mounted below respective pairs of entry conveyor belts 51, 53 detect the presence of a plate stopped by respective entry conveyor stops 97, 99. If a plate conveyed by a pair of entry conveyor belts is not to be inspected (if the plate is a single-wide, black and white plate, for example), the stops for that pair of belts remain in their normally lowered position to permit the plate to fall off the belts into the storage bin 65. A photoelectric sensor 103 (generally referred to as double-plate detecting means) is positioned between the left and right pairs of entry conveyor belts 51, 53 adjacent the upstream end of the conveyor to detect any double-wide plates conveyed from the bending apparatus. If a double-wide plate is detected, this sensor 103 sends an override signal to the controller PLC to prevent movement of the entry conveyor stops 97, 99 to their stopping positions. Consequently, any double-wide plates will also pass through and fall into the storage bin.

Inspection entry stop means comprising a pair of solenoid operated stops 107 are mounted adjacent the entrance to the inspection station 37 for preventing a plate from entering the inspection station until the preceding plate at the inspection station has been conveyed from the station. A photoelectric inspection entry sensor 109 detects the presence of a plate held by the entry inspection stops 107 at this location. When released to move through the inspection station, a plate travels in a generally horizontal plane from left to right as viewed in FIG. 7, with the front and rear flanges 7, 9 extending down from the plate and generally parallel to the direction of travel, and with the sides 5 of the plate extending generally perpendicular to the direction of travel.

Figure 10:
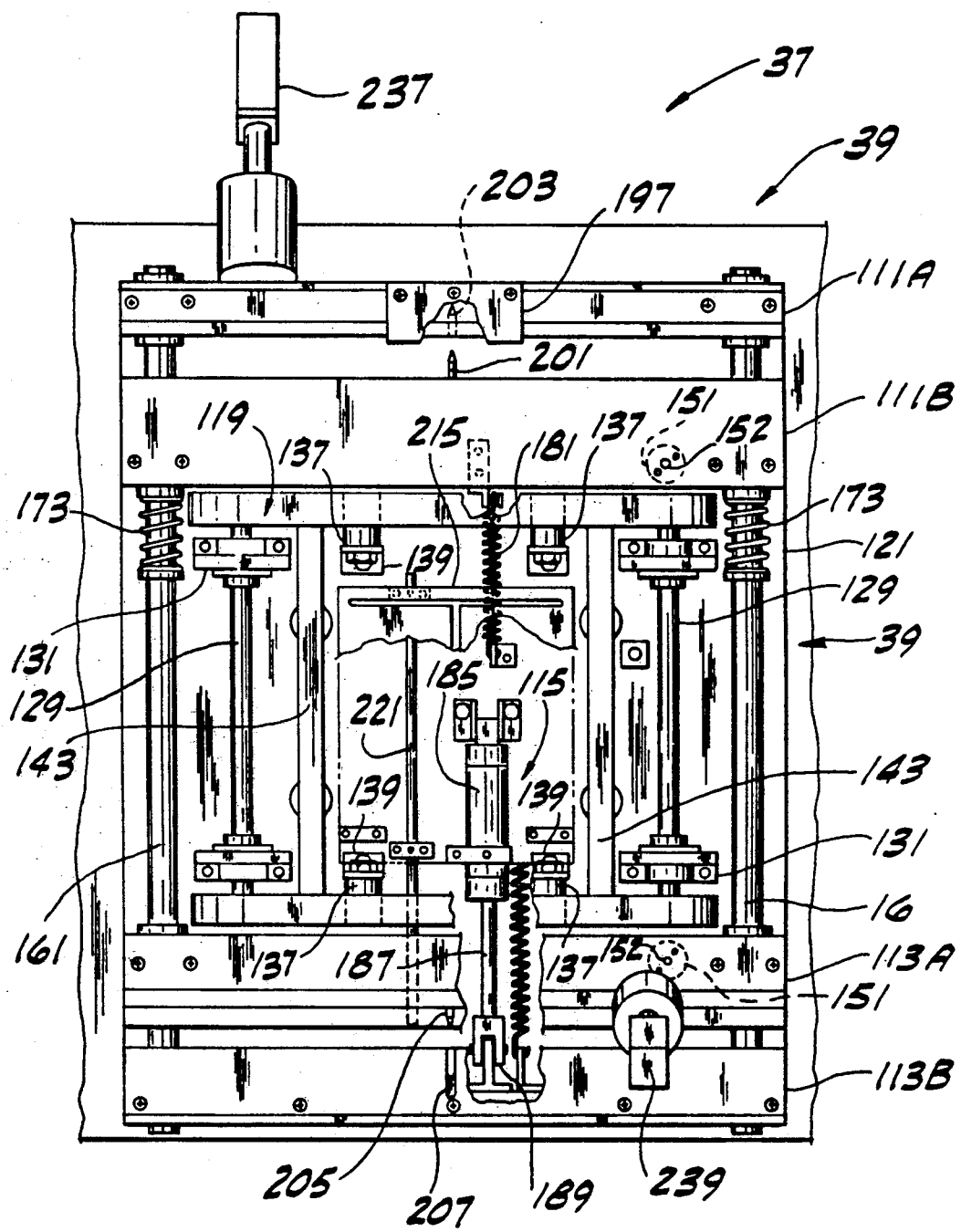
FIG. 10 is an enlarged plan of an inspection station of the apparatus, parts being broken away to show details.

As illustrated in FIG. 10, positioning means 39 at the inspection station comprises a first pair of jaws 111A and 111B, a second pair of jaws 113A, 113B spaced from the first pair in a direction generally transverse to the direction of plate travel through the inspection station, and jaw-operating means generally designated 115 for opening and closing the jaws in a manner to be described. An inspection station conveyor, indicated generally at 119, is located between the two pairs of jaws and functions to convey a plate from the entry transfer conveyor 69 into a preliminary position preparatory to inspection of the plate, and to convey the plate from the inspection station 37 after the plate has been inspected. The jaws and inspection station conveyor are mounted on a subframe 121 removably attached to the main frame for ease of assembly and maintenance.

More specifically, the inspection station conveyor 119 comprises a pair of endless belts 123 (endless belt means, generally speaking) which lie in spaced vertical planes and which are trained around pulleys 127 on shafts 129 journalled in bearing blocks 131 mounted on the subframe 121 (FIG. 11). The shafts 129 are rotated by a motor 135 to drive the belts 123. The belts have horizontal upper and lower reaches, the lower reaches being supported by horizontal idler rolls 137 mounted on supports 139 extending up from the subframe 121. The upper reaches of the belts 123 are adapted to be moved from a raised position (FIG. 11) for accepting a plate from the entry transfer conveyor 69 and conveying it to the stated preliminary position at the inspection station, to a lowered position for depositing the plate on an appropriate support surface (the tops of jaws 111B and 113A, for example) with the front flange 7 of the plate extending down between jaws 111A and 111B (hereinafter referred to as the "front jaws") and the rear flange 9 of the plate extending down between jaws 113A and 113B (hereinafter referred to as the "rear jaws"), and then back to the stated raised position for conveying a plate from the inspection station 37 after the inspection process is complete. The upper reaches of the endless belts 123 are raised and lowered by a pair of horizontal lifter bars 143 engageable with the upper reaches generally adjacent the ends of the belt conveyor. These bars 143 are carried by lifting cylinders 145 mounted on the subframe 121 and under the control of the controller PLC to raise and lower the bars as necessary. The lifter bars 143 are of durable low-friction material, such as high-density polyethylene, to minimize interference with the operation of the belts 123. When the lifting cylinders 143 are extended, the lifter bars raise the upper reaches of the belts 123 to a level slightly (e.g., $\frac{1}{4}$ in.) above the upper surfaces of the jaws so that the plate does not drag or scrape on the jaws as it moves to its stated preliminary position.

A pair of solenoid-operated stops 151 are mounted adjacent the exit end of the inspection station 37 on jaws 111B and 113A (see FIG. 7). These inspection exit stops 151, which are under the control of the programmable controller PLC, are movable between a stopping position in which they extend up through relief holes 152 in the jaws 111B, 113A for engagement by the leading side edge 5 of a plate to stop the plate in its stated preliminary position, and a non-stopping position in which they are retracted to permit a plate which has been inspected to be conveyed away from the inspection station. A photoelectric exit inspection sensor 153 is mounted on the subframe 121 adjacent the stops 151 to detect the presence of a plate in the stated preliminary position.

The construction of the jaws of this invention is best illustrated in FIGS. 12A-12C. As depicted, jaws 111A and 113A are rigidly affixed to the subframe 121 and jaws 111B and 113B are movable relative to the subframe and relative to their respective mating jaws All four jaws (which may also be referred to as "mandrels") are constituted by horizontally disposed metal bars extending parallel to the direction of plate travel. The two movable jaws 111B, 113B are connected by a pair of parallel horizontal slide rods 161 extending through bushings 163 in the bases 165 of the fixed jaws 111A, 113A and through a bushing 167 in the base 169 of the movable front jaw 111B. The movable rear jaw 113B is fastened in fixed position on the slide rods 161. The rods 161 are slidably movable in the direction of their lengths to permit the movable jaws 111B, 113B to open and close relative to the fixed jaws 111A, 113A. Each slide rod has a collar 171 thereon, and a coil compression spring 173 is positioned on the rod between this collar 171 and the movable front jaw 111B, the spring being compressible to permit the movable front and rear jaws to move relative to one another. The movable front jaw is urged toward an open position by a return spring 181 attached to the subframe 121 (FIG. 10). When the jaws are fully open, the rear jaws 113A, 113B are spaced from one another a distance slightly greater than the spacing between the front jaws 111A, 111B. Thus, the front jaws are adapted to complete their closure prior to closure of the rear jaws, as will appear.

Jaw-operating means 115 comprises a pneumatic or hydraulic cylinder 185 mounted on the subframe 121 (FIG. 10). The cylinder has a rod 187 connected via a clevis connection 189 to the movable rear jaw 113B. Since the movable jaws 111B, 113B are connected by the slide rods 161 in the manner described, retraction of the cylinder rod 187 is operable to close the jaws 111A, 111B and 113A, 113B to clamp the front and rear flanges 7, 9 of a plate resting on the jaws, thereby holding the plate in the stated fixed reference position so that the plate may be inspected by inspecting means 41. The jaw-closing sequence is such that the front jaws 111A, 111B close first to clamp the front flange 7 of the plate, with continued retraction of the cylinder rod 187 acting to compress the coil compression springs 173 on the slide rods 161 to enable the rear jaws 113A, 113B to close against the rear flange 9 of the plate. Extension of the cylinder rod 187 functions to open the jaws. Extension and retraction of the cylinder actuates a first reed switch 190A (FIG. 19C) at a point of cylinder extension corresponding to full extension and a second reed switch 190B at a point corresponding to a predetermined separation of the rear jaws 113A, 113B (e.g., ⅜ in.) in a near-closure position. The significance of this will become apparent in the description of the operation of the apparatus.

It will be observed from FIG. 12A that the front and rear pairs of jaws have clamping surfaces which are configured to match the bent configurations of the front and rear flanges 7, 9 of a plate. More specifically, the fixed front jaw 111A has a recess 191 extending the length of the jaw for receiving the front flange 7 of the plate, and the movable front jaw 111B is formed for a close fit in recess 191 to tightly clamp the flange 7 against the fixed jaw. The rear jaws 113A, 113B have a similar mating fit, with the movable rear jaw 113B being recessed as shown at 195 to receive the fixed rear jaw 113A when the two jaws close to clamp the rear flange 9 of the plate. The configuration of the jaws may be changed according to the configuration of the plate flanges 7, 9 and the press on which the plates will be mounted. The front fixed jaw 111A has a horizontal guide plate 197 with a tapered side edge fastened to its upper surface for guiding the front flange 7 of the plate into recess 191 as the front jaws 111A, 111B close.

As illustrated in FIGS. 10 and 12A, a first registration pin 201 projects horizontally from the movable front jaw 111B. As the front jaws 111A, 111B close, this pin is adapted to move through the notch opening 17 in the front flange 7 of a Plate at the inspection station. The fixed front jaw 111A has a hole 203 in it for receiving the pin 201 when the front jaws are closed. A second registration pin 205 projects at an upward incline from the fixed rear jaw. As the rear jaws close this pin is adapted to move through the notch opening 19 in the rear flange of the plate. The movable rear jaw has a recess 207 in it for receiving this pin when the rear jaws are closed. The second registration pin 205 is retractible by a cylinder indicated at 211 (FIG. 13) to a position where the tip of the pin is generally flush or recessed with respect to the clamping face of the fixed rear jaw 113A on which it is mounted. The two registration pins 201, 205 serve to precisely locate the plate P in side-to-side direction (i.e., in the direction of plate travel through the inspection station 37). Both pins 201, 205 have pointed tips to provide some tolerance in case there is a discrepancy in side-to-side direction between the stated preliminary position of the plate and the final fixed reference position of the plate.

Figure 14:
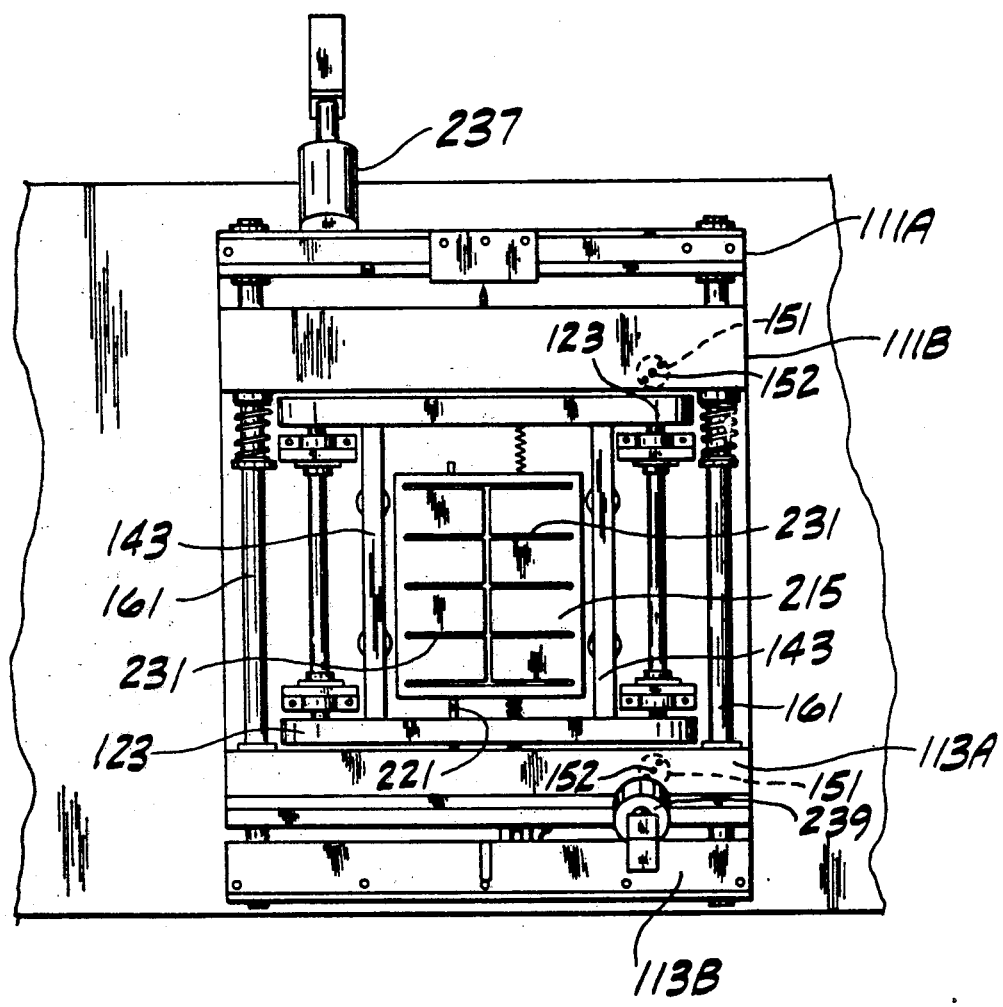
FIG. 14 is a plan of the inspection station showing the jaws open.
Figure 15A:
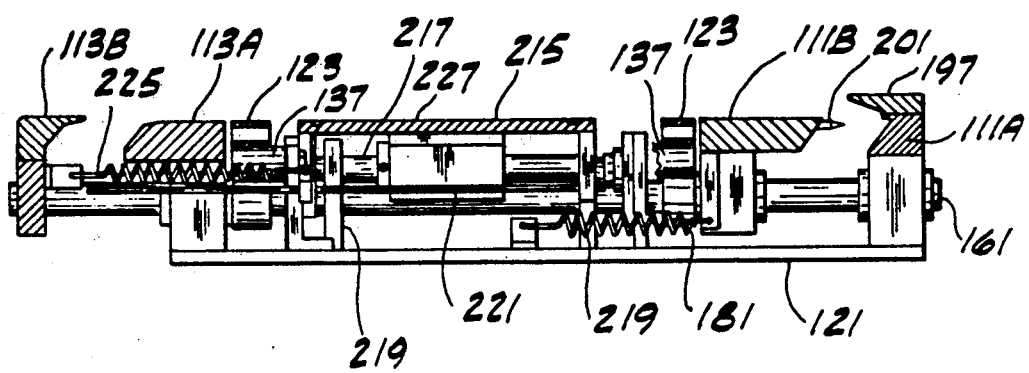
FIG. 15A-15C are views illustrating movement of a vacuum table as the jaws close.
Figure 15B:
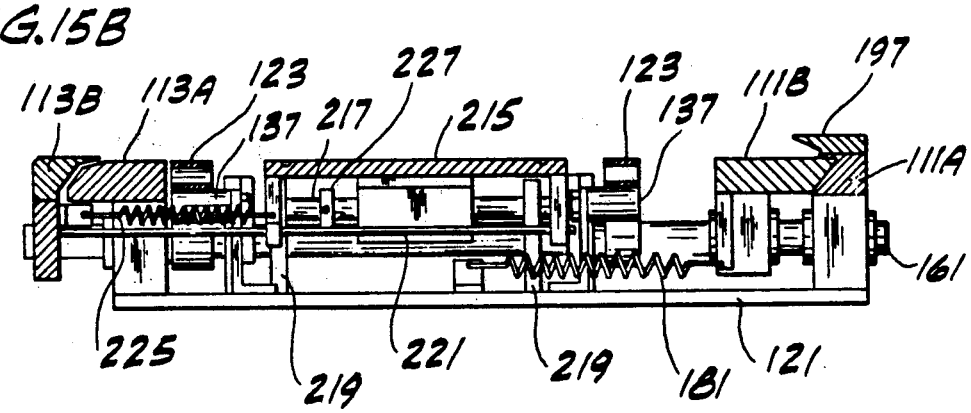
Figure 15C:
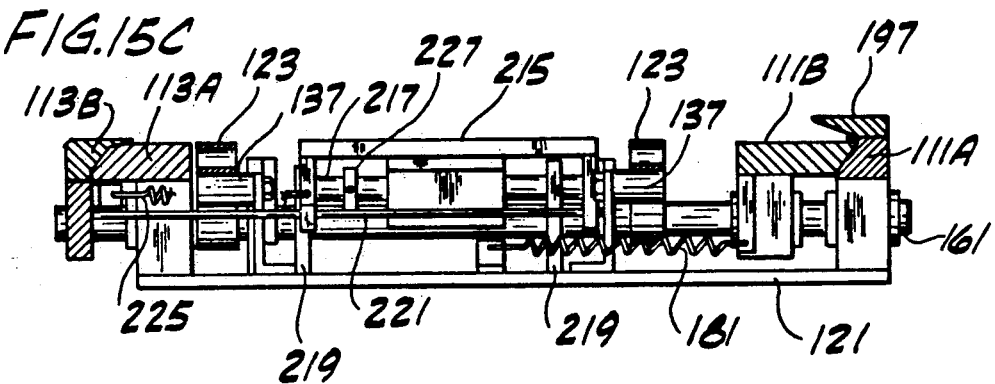

As illustrated in FIG. 14, a vacuum table 215 is centrally located in the inspection area between the pairs of jaws 111A, 111B and 113A, 113B and between the conveyor lifter bars 143. The table is slidably mounted on a horizontal guide rod 217 attached to suitable posts 219 extending up from the subframe 121 (see FIGS. 15A-15C) for sliding movement of the table in a generally horizontal plane and in a direction generally transverse to the direction of plate movement through the inspection station. The table 215 has a horizontal pusher bar 221 extending therefrom, the end of which is positioned for engagement by the movable rear jaw 113B, the arrangement being such that the table is adapted to be pushed toward the front jaws 111A, 111B as the rear jaws 113A, 113B close. There is a gap between the end of the pusher bar 221 and the rear movable jaw 113B when the latter jaw is open (see FIG. 15A) so that initial movement of the rear jaw toward its closed position does not result in movement of the vacuum table 215. A spring 225 interconnecting the table and the movable rear jaw 113B urges the table 215 toward the rear jaws 113A, 113B. Travel of the table on the guide rod in the direction toward the rear jaws is limited by a stop 227 on the guide rod, the arrangement being such that, upon opening of the rear jaws 113A, 113B, movement of the table 215 toward the rear jaws under the urging of return spring 225 is stopped prior to the front jaws 111A, 111B reaching a fully open position. This ensures that the first registration pin 201 is withdrawn from the registration notch 17 in the front flange 7 of the plate after the jaws have opened. The table 215 has grooves 231 in its upper surface connected to a suitable vacuum generator (not shown) for vacuum gripping a plate overlying the table at the inspection station. The upper surface of the table lies generally in the same plane as the upper surfaces of the jaws 111B, 113A on which a plate at the inspection station rests. Operation of the vacuum is under the control of the programmable controller PLC.

Figure 16:
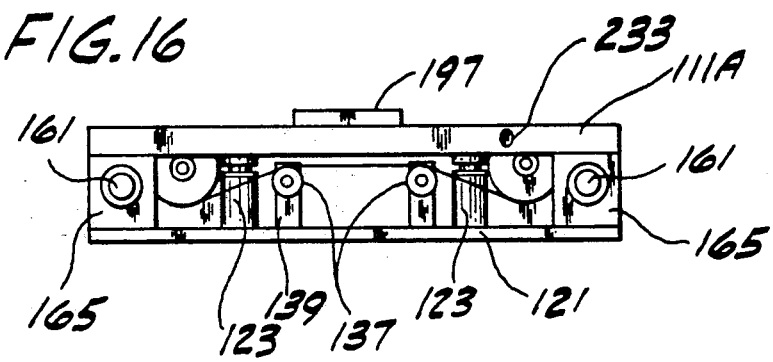
FIG. 16 is a side elevation of the inspection station showing a viewing aperture in one of the front jaws.
Figure 17:
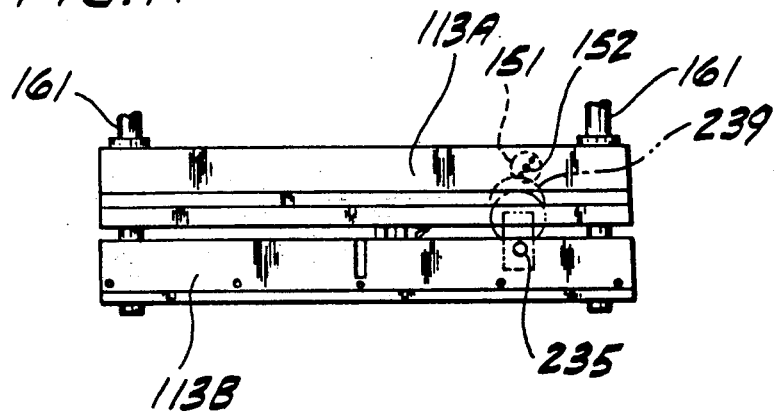
FIG. 17 is plan of the inspection station showing a viewing aperture in one of the rear jaws.

When the plate is held in its fixed reference position, the registration marks R1 and R2 on the plate should be visible. As depicted in the drawings (FIG. 1 and 3), one registration mark R1 is on the front flange 7 of the plate and the other mark R2 is on its rear flange 9. To permit these marks to be viewed, suitable viewing apertures 233, 235 are provided in the fixed front jaw 113A and the movable rear jaw 113B (see FIGS. 16 and 17).

Inspection means 41 is an electronic inspection system (see FIG. 5) comprising two cameras 237 and 239 suitably mounted on the frame 31 or subframe 121 for optically inspecting the registration marks R1, R2 on the plate through viewing apertures 233, 235, and appropriate means, including inspection system software, for comparing the position of the registration marks R1, R2 to a master reference in electronic memory indicative of the proper registration of the image on the plate P. As shown in the block diagram of FIG. 5, this software is loaded in a personal computer 241 adapted to receive a trigger signal from the programmable controller PLC to initiate the inspection process. The personal computer is also connected to the two cameras 237, 239 for receiving inspection data therefrom. Based on the aforesaid comparison, the inspection system automatically makes a determination according to selected (and adjustable) parameters as to whether the image I on the plate is in proper registration relative to the plate, and an appropriate plate "accept" or plate "reject" signal sent to the programmable controller PLC. Such an inspection system is commercially available from Harland Simon Scanning Systems, Ltd., Smith House, Bond Ave, Milton Keynes, MKI 1UH, England. If an accept or reject signal is not provided within a selected time interval (e.g., 3 to 5 seconds per plate), an alarm may be sounded to alert an operator. Similarly, if a reject signal is sent, indicating that the image on a particular plate is out of registration, an alarm signal may also be sent so that appropriate measures may be taken to make a new plate.

Referring to FIGS. 7 and 18, exit conveyor means 43 comprises an exit transfer conveyor 245 immediately downstream of the inspection station 37 for receiving a plate conveyed from the inspection station by the inspection conveyor and conveying it against a fixed stop or wall 247, and a sorting conveyor 251 for conveying the plate either to the "reject" bin 45 or to the "accept" bin 47. The exit transfer conveyor 245 is a roller conveyor driven by a motor 253 (FIG. 7) and is similar in construction to the entry transfer conveyor 69, so that further description is unnecessary. Suffice it to say that the conveyor 245 is movable by appropriate cylinder means 255 (FIG. 6) under the control of the programmable controller PLC between a raised position in which the tops of its rollers 257 are disposed above the sorting conveyor 251 for conveyance of a plate from the inspection station 37 for impact against the stop wall 247, and a lowered position in which the tops of the rollers 257 are disposed below the upper reach of the sorting conveyor 251 to deposit the plate on the latter. The exit transfer conveyor 245 is normally maintained in its raised position. A photoelectric sensor 261 is provided for detecting the presence of a plate after it has impacted against the stop wall 247.

The sorting conveyor 251 is a belt conveyor comprising a pair of spaced apart belts 265 oriented in parallel vertical planes extending generally at right angles to the direction of plate travel through the inspection station. The belts 265 are trained around pulleys 267 mounted on horizontal shafts 269 journalled in bearing blocks 271 secured to the frame 31. As shown in FIG. 6, one of the shafts 269 has a sprocket mounted on it in mesh with a chain 273 extending around a drive sprocket on the shaft of a reversible motor 275, also under the control of the programmable controller PLC. The arrangement is such that the motor 275 is responsive to a signal from the programmable controller to run either in a forward direction or a reverse direction. When running in a forward direction, the motor 275 is operable to move the sorting conveyor 251 in one direction to convey a plate to the "reject" bin 45, for example, and when running in reverse, the motor is operable to move the sorting conveyor in the opposite direction to convey a plate to the "accept" bin 47, for example.

While not shown in the drawings, the inspection apparatus may include safety covers for covering the entry conveyor means 49, the inspection station 37, and the exit conveyor means 43. Suitable interlocks (not shown) may also be provided to prevent the removal of these covers during operation of the apparatus.

Figure 19B:
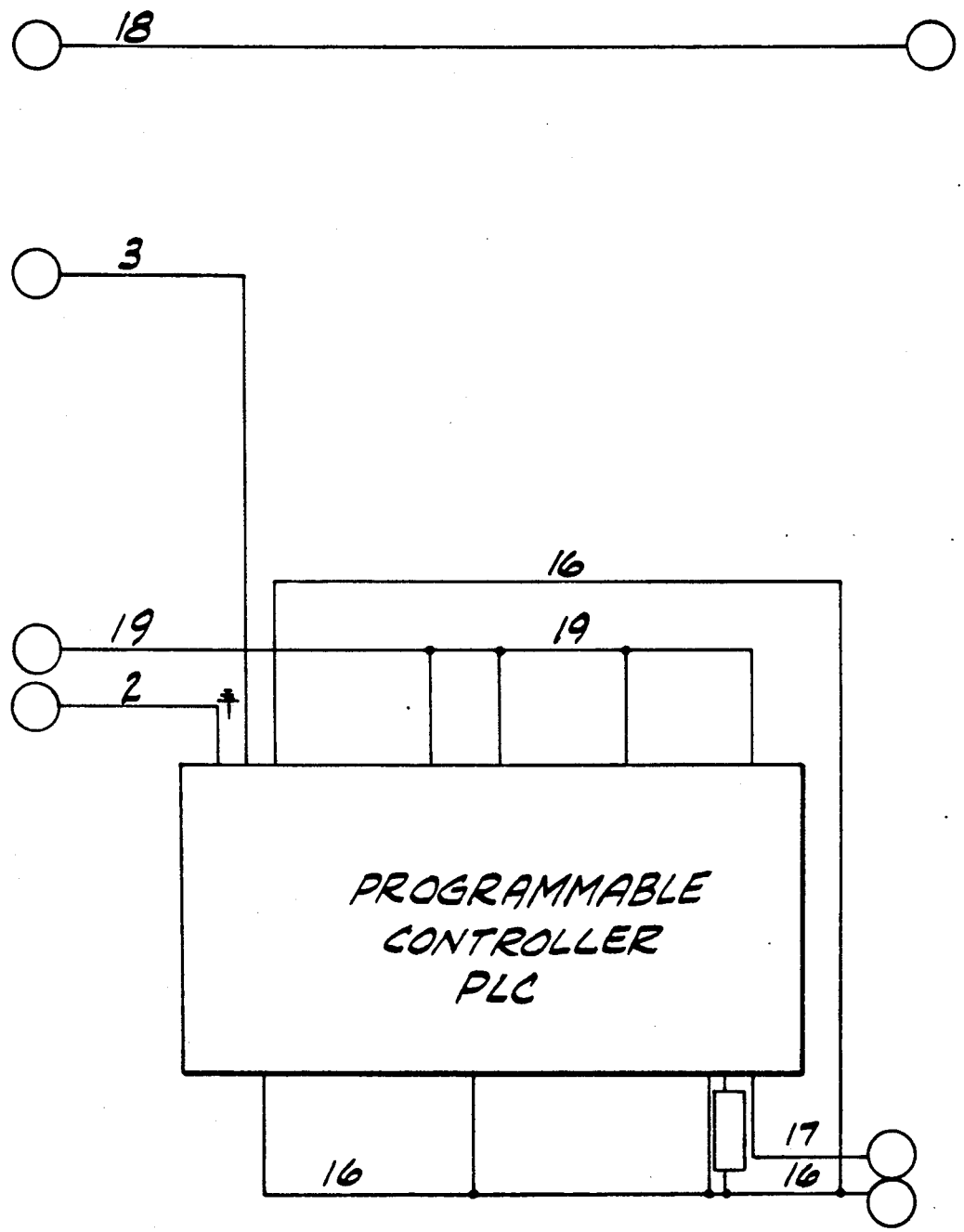
Figure 19C:
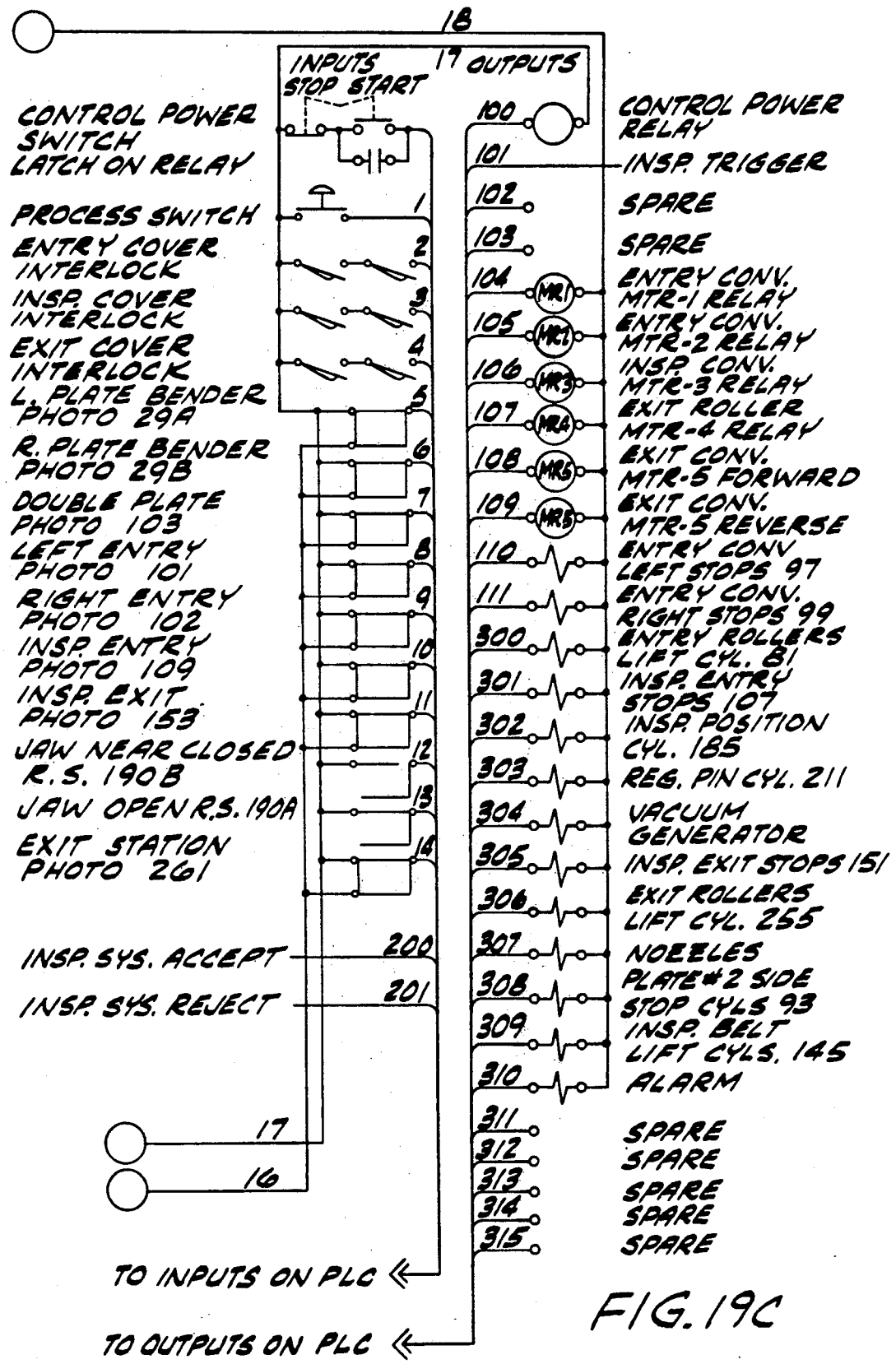

FIGS. 19A–19C illustrate an electric circuit of the present invention. The programmable logic controller PLC is indicated at PLC in FIG. 19B and may be of any suitable type, such as controller PLC sold under the trade designation C60 by Omron Electronics of Japan having a place of business at Schaumburg, Ill. The controller PLC is connected to a suitable power source 281 (FIG. 19A) and has a series of input pins connected to inputs 1–14 (FIG. 19C) corresponding to a start switch for starting the inspection apparatus (input 1), limit switches for the cover interlocks (inputs 2–4), the photosensors for detecting whether a plate is to be inspected, such as photosensors 29A, 29B in bending apparatus 25 (inputs 5–6), the double-plate photosensor 103 (input 7), the left and right entry conveyor photosensors 101, 102 (inputs 8–9), the inspection entry and inspection exit photosensors 109, 153 (inputs 10–11), the jaw reed switches 190B, 190A (inputs 12–13), the stop wall photosensor 261 (input 14), and the inspection system "accept" and "reject" inputs (inputs 200 and 201). The controller also has a series of output pins connected to the labelled outputs (FIG. 19C), that is, output 100 for the control power relay, output 101 for the inspection trigger signal and outputs 104–107 for relays controlling the operation of entry conveyor motor 63, entry transfer conveyor motor 85, inspection station conveyor motor 135, and exit transfer conveyor motor 253, respectively; outputs 108 and 109 for relays controlling the operation of the reversible motor 275 running the sorting conveyor 251; outputs 110 and 111 for the solenoid valves controlling the operation of the entry conveyor stops 97, 99; output 300 for the solenoid valve controlling the operation of the lift cylinder 81 for the entry transfer conveyor 69; output 301 for the solenoid valve controlling the operation of the cylinders for the inspection entry stops 107; output 302 for controlling the inspection position (jaw-operating) cylinder 185; output 303 for the solenoid valve controlling the operation of the registration pin cylinder 211; output 304 for the solenoid valve controlling the operation of the vacuum generator; output 305 for the solenoid valve controlling the operation of the inspection exit stops 151; output 306 for the solenoid valve controlling the operation of the lift cylinder 255 for the exit transfer conveyor 245; output 307 for the solenoid valve controlling air nozzles used to assist stacking of plates in the storage bins 45, 47, 65; output 308 for the solenoid valve controlling the operation of the cylinders 93 operating the restraining bar; and output 309 for the solenoid valve controlling the operation of the belt lift cylinders 145 at the inspection station.

Motor relay outputs 104–107 open and close relay contacts MR-1, MR-2, MR-3 and MR-4, respectively, for operating motors 63, 85, 135 and 253, respectively, in the manner described below (FIG. 19A). Motor relay outputs 108 and 109 work in conjunction with a reversible contactor mechanism 351, the arrangement being such that a signal from one output closes contacts 2–3, 5–6 and 8–9 to drive the sorting conveyor motor 275 forward to run the sorting conveyor 251 in one direction, and a signal from the other output closes contacts 1–2, 4–5 and 7–8 to drive the sorting conveyor motor 275 in reverse to run the sorting conveyor 251 in the opposite direction.

The programmable controller PLC is suitably programmed to carry out the various operations of inspection apparatus 1 in the manner described below. The listing of a program found to be suitable for this purpose is appended hereto as Appendix A.

In operation, the programmable controller PLC of the inspection apparatus 1 is adapted to receive a signal from a suitable source (e.g., bender photosensors 29A, 29B) identifying each plate to be inspected. The entry conveyor belts 51, 53 of the inspection apparatus are adapted to accept plates as they are delivered from the bending apparatus 25 by means of conveyors 27. Unless the plate is to be inspected, the entry conveyor stops 97, 99 will remain in their non-stopping positions so that plates not requiring inspection will be conveyed directly into the storage bin. If the plate is to be inspected (if it is a single-wide color plate, for example), the programmable controller PLC will energize the solenoids of the entry conveyor stops 97 or 99 on the appropriate pair of endless belts 51, 53 to cause the stops to move to their stopping positions. When the plate has been stopped, as detected by a respective pair of entry conveyor photosensors 101 or 102, cylinder 81 is actuated to raise the entry roller conveyor 69 to cause the plate to be conveyed sideways toward the inspection station 37.

If two plates to be inspected are simultaneously held side-by-side at the downstream end of the entry conveyor 49 (one plate on each of the two pairs of belts 51, 53), cylinders 93 are actuated as the roller conveyor 69 is raised to lift the restraining bar 91 to its restraining position to prevent the plate on the left pair of belts 51 (the pair farthest from the inspection station 37) from moving on the roller conveyor until the closer plate has moved into the inspection station. The restraining bar cylinders 93 are on a short time delay, which is sufficient to allow any previous plate on the roller conveyor 69 to move into the inspection station, after which delay the restraining bar returns to its non-restraining position to permit the plate to be conveyed sideways by the rollers 71 toward the inspection station. The roller conveyor moves to its lowered position when the last plate on the roller conveyor has moved into the inspection station (as detected by the inspection entry photosensor 109). The two inspection entry stops 107 at the entrance to the inspection station are normally in a stopping position for preventing a plate from moving into the inspection station until the preceding plate has been inspected and conveyed out of the inspection station, as detected by stop wall sensor 261. At this time the inspection exit stops 151 at the downstream end of the inspection station 37 move to their stopping position and the inspection entry stops at the upstream end of the inspection station move to their non-stopping position to allow a new plate to be conveyed into the inspection station. The inspection entry stops 107 return to their raised position after the plate has moved into the inspection station, as detected by the inspection entry sensor 109.

As a plate is conveyed into the inspection station by the entry roller conveyor 69, it is accepted by the inspection station conveyor belts 123, the upper reaches of which are raised by the lifting bars 143 so that the plate is conveyed at a level slightly above the upper surfaces of the jaws 111B, 113A until the leading side 5 of the plate contacts the inspection station exit stops 151, as detected by the inspection exit sensor 153. The lifter cylinders 145 then retract to lower the upper reaches of the conveyor belts 123 to deposit the plate on the upper surfaces of the jaws 111B, 113A and the vacuum table 215 in its stated preliminary position with the front and rear flanges 7, 9 extending down between respective open jaws 111A, 111B and 113A, 113B, as shown in FIG. 12A. It will be noted that the plate is deposited in a position where its front edge 1 projects beyond the movable front jaw 111B a distance sufficient to allow the front flange 7 of the plate to clear the fixed registration pin 201 projecting from the jaw. The second registration pin 205 projecting from the fixed rear jaw 113A is retracted so that clearance is not a concern. When the lifter cylinders 145 reach a fully retracted position, the motor 135 for the inspection station conveyor 119 is turned off and the inspection station exit stops 151 move to their non-stopping position, thereby allowing the plate P to be shifted in downstream direction, if necessary, as the plate moves from its preliminary position to its fixed reference position. The jaw closing process then begins.

Closure of the jaws is effected by retraction of the jaw cylinder 185, which causes the movable front and rear jaws 111B, 113B to move toward their closed positions. The movable rear jaw 113B moves because it is connected directly to the cylinder rod 187. The movable front jaw 111A closes under the force exerted by the coil compression springs 173 on the slide rods 161 (the combined force of these two springs 173 is considerably greater than the force exerted by the return spring 181 attached to the movable rear jaw 111B). As noted above, when the jaws are fully open, the rear jaws 113A, 113B are spaced from one another a distance slightly greater than the spacing between the front jaws 111A, 111B. Thus, the front jaws 111A, 111B complete their closure first to clamp the front edge flange 7 of the plate in fixed position, with the registration pin 201 on the front movable jaw 111B entering the registration notch 17 on the front flange of the plate to locate the plate precisely in side-to-side direction relative to the plate. As the rear jaws 113A, 113B approach a closure position, as detected by reed switch 190B, cylinder 211 is actuated to extend the second registration pin 205 through the notch 19 in the rear flange 9 of the plate. Continued retraction of the cylinder 185 compresses the two coil compression springs 173 until the rear movable jaw 113B closes against its mate 113A to clamp the rear flange 9 of the plate. With the plate flanges 7, 9 clamped between respective jaws, and the registration pins 201, 205 through the registration notches 17, 19, the plate is held in the aforementioned fixed reference position for inspection.

The vacuum table 215 also moves during the jaw closure process. As the rear movable jaw 113B moves toward its closed position, it engages the pusher bar 221 extending from the table and moves the table forward (toward the right as viewed in FIGS. 15A-15C). After a predetermined delay following actuation of reed switch 190B (the delay being sufficient to allow the rear jaws 113A, 113B to close), the vacuum generator generates a vacuum on the vacuum table 215, causing the table to vacuum grip the plate thereon thereby to further ensure that the plate is held in the stated fixed reference position during inspection. A trigger signal (see FIG. 5) is then transmitted by the controller PLC to the inspection system software loaded in the personal computer 241, to initiate the inspection process.

During inspection the two cameras 237, 239 optically inspect the plate at the inspection station. Specifically, the cameras inspect the registration marks R1 and R2 through the two viewing apertures 233, 235 and transmit this optical data to the personal computer. The inspection system software then compares the position of the registration marks (using pixel locations, for example) against a master reference in electronic memory indicative of the proper registration of the image on the plate. If the registration marks are within a selected tolerance range, an "accept" signal is sent to the programmable controller (to output 200 as shown in FIG. 5); if not, a "reject" signal is sent to the controller (to output 201 as shown in FIG. 5). An alarm signal may be generated in response to a reject signal to notify an operator who can take appropriate action to arrange for the processing of a new plate, if necessary. If no signal is received within a predetermined interval of time (e.g., 5 seconds), indicating that the inspection process has not been completed, an alarm signal may also be sent to alert the operator.

It is preferable to use two registration marks (e.g., R1 and R2) rather than a single mark to guard against an instance where one mark is in the proper location, but where the plate is skewed or bent so that the overall image is out of registration. However, it will be understood that a single registration mark can be used without departing from the scope of this invention.

After inspection is complete, the cylinder 211 is actuated to retract the second registration pin 205, and the jaw cylinder 185 is actuated to extend its piston rod 187, thereby causing the movable rear jaw 113B to open and allowing the movable front jaw 111B to return to its open position under the urging of its return spring 181. During the initial stages of jaw opening, the vacuum table 215 also moves toward the fixed rear jaw under the urging of its return spring 225. A vacuum is still being drawn on the table, so the plate P is forced to move with the table away from the fixed front jaw 111A, thereby ensuring separation of the front flange 7 of the plate from the recess 191 in the jaw. The vacuum table is engageable with the stop 227 to limit movement of the table (and thus the plate thereon) away from the fixed front jaw 111A, the result being that the plate returns to a position approximating its initial preliminary position. The jaw cylinder 185 continues to extend to effect a full opening of the front and rear jaws. As the front movable jaw 111B continues to open relative to the plate, the first registration pin 201 withdraws from the registration notch opening 17 in the front flange 7 of the plate.

When the jaw-opening cylinder 185 reaches its full extension, indicating that the jaws are fully open, the reed switch 190A is actuated to signal a cutoff of the vacuum, energization of the motor 135 driving the inspection station conveyor 119, and actuation of the lifter cylinders 145 to raise the upper reaches of the conveyor belts 123 into engagement with the plate to convey the plate from the inspection station onto the exit roller conveyor 245 which is in its normally raised position. The plate is thus conveyed against the stop wall 247, as detected by sensor 261. The inspection station stops 151 then return to a stopping position and the entry stops 107 at the entry to the inspection station retract to a non-stopping position to allow the next plate to be conveyed by the entry roller conveyor 69 onto the inspection station conveyor 119 (which is still raised and running) for delivery to the stated preliminary position. Meanwhile, when sensor 261 senses the presence of a plate at the stop wall 247, a signal is sent to retract cylinder 255 to lower the exit roller conveyor 245 to deposit the plate on to the sorting conveyor 251. Depending on the signal received from the inspection station, the reversible motor 275 will be energized to run the sorting conveyor 251 in forward direction to deliver a plate to the "accept" bin 47 or in reverse direction to deliver a plate to the "reject" bin 45.

It will be observed from the foregoing, therefore, that the apparatus 21 of this invention is capable of handling single and double-wide plates, whether color or black and white, and that it inspects only single-wide color plates and then sorts them according to whether the images thereon are in registration with the plates. This is accomplished after the plates have been bent and are in final form, so that verification of registration is accurate, and without manual handling of the plate after it has exited the bending apparatus, thereby greatly expediting processing of the plates. It will be understood that while the inspection apparatus is described as inspecting only single-wide color plates, the apparatus may be suitably modified to inspect double-wide plates as well.

In view of the above, it will be seen that the several objects of the invention are achieved and other advantageous results attained.

As various changes could be made in the above methods and constructions without departing from the scope of the invention, it is intended that all matter contained in the above description or shown in the accompanying drawings shall be interpreted as illustrative and not in a limiting sense.

PROGRAM LISTING
APPENDIX A

Filename: ais     Ladder Diagram Printout     Line 1     Page 1
May 21, 1991                                                                                                                                                                      10:23 am

```
        Turns on Control Power Relay
        CONTROL                                                                           CONTROL
        POWER SW                                                                          POWER
0000 |------] [----------------------------------------------------------------------------( )
           00000                                                                             00100

Sends plates straight through if Process switch is not on.
        PROCESS    CONTROL                                                                 STRAIGHT
        SWITCH     POWER SW                                                                THRU MODE
0002 |------]/[--------] [------------------------------------------------------------------( )
           00001        00000                                                                01000

Activates Process Mode
        PROCESS    CONTROL                                                                 PROCESS
        SWITCH     POWER SW                                                                MODE
0005 |------] [---------] [------------------------------------------------------------------( )
           00001        00000                                                                01001

Entry Conveyor Motor Relay
        STRAIGHT                                                                           ENTRY
        THRU MODE                                                                          CONV. M1
0008 |------] [-----+-----------------------------------------------------------------------( )
           01000    |                                                                        00104
                    |
        PROCESS     |
        MODE        |
        |------] [--+
           01001

Double Page Mode.
        DOUBLE     DOUBLE     ENTRY                                                        DOUBLE
        PAGE PS    DELAY      LIFT CYL                                                     MODE
0011 |------] [-----+--------]/[--------]/[-------+---------------------------------------( )
           00007    |   T011       00300          |                                          01007
                    |                             |
        DOUBLE      |                             |  L PLATE   R PLATE    DOUBLE   DOUBLE
        MODE        |                             |  BENDER PS BENDER PS  PAGE PS  DELAY
        |------] [--+                             +------]/[--------]/[--------]/[---- (TIM )
           01007                                       00005      00006      00007    [ T011]
                                                                                      [ #0035]

Interlock
        PROCESS
        SWITCH
0022 |------] [-------------------------------------------------------------------------[FUN 02]
           00001                                                                        [   IL]
```

Filename: ais     Ladder Diagram Printout     Line 54     Page 2
May 21, 1991                                                                                                                                                                      10:23 am

```
        Sets Left plate for inspection
        L PLATE    DOUBLE     ENTRY                                                        INSPECT
        BENDER PS  MODE       STOPS DWN                                                    L PLATE
0024 |------]/[-----+--------]/[--------]/[----------------------------------------------( )
           00005    |    01007      T010                                                    01002
                    |
        INSPECT     |
        L PLATE     |
        |------] [--+
           01002

Sets Right plate for inspection
        R PLATE    DOUBLE     ENTRY                                                        INSPECT
        BENDER PS  MODE       STOPS DWN                                                    R PLATE
0029 |------]/[-----+--------]/[--------]/[----------------------------------------------( )
           00006    |    01007      T010                                                    01003
                    |
        INSPECT     |
        R PLATE     |
        |------] [--+
           01003
```

-continued
PROGRAM LISTING
APPENDIX A

```
       Entry Stops for Left Plate. Stops are normally down.
       INSPECT      STRAIGHT                                                    ENTRY
       L PLATE      THRU MODE                                                   LT. STOPS
0034   ----] [-------]/[---------------------------------------------------------- ( )
        01002        01000                                                       00110

Entry Stops for Right Plate. Stops are normally down.
       INSPECT      STRAIGHT                                                    ENTRY
       R PLATE      THRU MODE                                                   RT. STOPS
0037   ----] [-------]/[---------------------------------------------------------- ( )
        01003        01000                                                       00111
```

Filename:           ais         Ladder Diagram Printout        Line    92     Page    3
May 21, 1991                                                                   10:23 am

```
       Delay for B&W plates to clear Entry station.
       LEFT         LOWER ENT                                                   ENTRY
       ENTRY PS     ROLLERS                                                     CLEARANCE
0040   ----] [---+---]/[------------------------------------------------------- (TIM  )
        00008   |  T009                                                          [ T000]
                |                                                                [ #0030]
       RIGHT    |
       ENTRY PS |
       ----] [--+
        00009   |
                |
       ENTRY    |
       CLEARANCE|
       ----] [--+
        T000

Raises Entry Rollers to take plates to Inspection Station.
       INSPECT      ENTRY        LOWER ENT                                      ENTRY
       L PLATE      CLEARANCE    ROLLERS                                        LIFT CYL
0045   ----] [---+---] [---------]/[-----------------------+------------------- ( )
        01002   |  T000          T009                      |                    00300
                |                                          |
       INSPECT  |                                          ENTRY CVR   ENTRY
       R PLATE  |                                          INTERLOCK   ROLLER M2
       ----] [--+                                          +---] [-------------- ( )
        01003   |                                               00002           00105
                |
       ENTRY    |
       LIFT CYL |
       ----] [--+
        00300

Prevents plates from overlapping in the inspection station.
       INSPECT      INSPECT      ENTRY        ENT LIFT                           ENTRY
       L PLATE      R PLATE      LIFT CYL     STOPS RST                          LIFT STOP
0055   ----] [-------] [---+---] [-----------]/[---------------------------------- ( )
        01002        01003 |  00300           T012                                00308
                           |
       ENTRY               |
       LIFT STOP           |
       ----] [-------------+
        00308
```

Filename:           ais         Ladder Diagram Printout        Line   138     Page    4
May 21, 1991                                                                   10:23 am

```
       Resets Entry Lift Stops
       ENTRY        INSP.        ENTRY                                          ENT LIFT
       LIFT STOP    ENTRY PS     LIFT CYL                                       STOPS RST
0061   ----] [-------]/[-----+---] [----------------------------------------- (TIM  )
        00308        00010  |  00300                                            [ T012]
                            |                                                   [ #0015]
       MANDREL              |
       CLOSED RS            |
       ----] [--------------+
        00012

Lowers Entry Stops.
       ENTRY                                                                   ENTRY
       LIFT CYL                                                                STOPS DWN
0066   ----] [------------------------------------------------------------- (TIM  )
        00300                                                                   [ T010]
                                                                                [ #0007]
```

-continued
PROGRAM LISTING
APPENDIX A

```
       Lowers Entry Rollers.
       ENTRY        INSP.         ENTRY CVR  ENTRY                                                        LOWER ENT
       ROLLER M2    ENTRY PS      INTERLOCK  LIFT STOP                                                    ROLLERS
0068  |---] [----------]/[-------------] [------------]/[--------------------------------------------     ------(TIM   )
           00105        00010         00002       00308                                                      [  T009]
                                                                                                             [ #0030]

Determines plate is entering the Inspection Station.
       ENTRY        INSP.         RESET                                                                   PLATE TO
       LIFT CYL     ENTRY PS      INSP MODE                                                               INSPECT
0073  |---] [----------] [------+--------]/[-------------------------------------------------------      ---------------( )
           00300        00010   |      01006                                                                    01005
                                |
       PLATE TO                 |
       INSPECT                  |
       |-------] [--------------+
              01005

Plate has cleared Inspection Entry Stops.
       PLATE TO     INSP.         RESET                                                                   ENTRY INS
       INSPECT      ENTRY PS      INSP MODE                                                               STOPS
0078  |---] [----------]/[------+--------]/[-------------------------------------------------------      ------(TIM   )
           01005        00010   |      01006                                                                 [  T001]
                                |                                                                            [ #0010]
       ENTRY INS                |
       STOPS                    |
       |-------] [--------------+
              T001
```

Filename:         ais        Ladder Diagram Printout         Line     192         Page     5
May 21, 1991                                                                                10:23 am

```
       Raises Inspection Entry Stops.
       ENTRY INS                                                                                          INSP. ENT
       STOPS                                                                                              STOPS
0083  |------] [-----------------------------------------------------------------------------------      ---------------( )
            T001                                                                                                00301

Start Inspection cycle. Delay for plate to completely enter.
       INSP.        RESET                                                                                 INSPECT
       EXIT PS      INSP MODE                                                                             DELAY
0085  |--------] [------+--------]/[----------------------------------------------------------------      ------(TIM   )
           00011        |      01006                                                                         [  T002]
                        |                                                                                    [ #0005]
       INSPECT          |
       DELAY            |
       |------] [-------+
              T002

Inspection Conveyor Motor.
       INSPECT      PROCESS                                                                               INSP.
       DELAY        MODE                                                                                  CONV. M3
0089  |---------]/[-------------] [------+-----------------------------------------------------------      ---------------( )
             T002        01001          |                                                                       00106
                                        |
       SAMPLE       MANDREL              |
       DURATION     OPEN RS              |
       |---------] [----------------] [------+
              T007            00013

Raises belts in inspection station.
       INSP.                                                                                              INSPECT
       CONV. M3                                                                                           BELTS
0095  |-------] [----------------------------------------------------------------------------------      ---------------( )
            00106                                                                                               00309

Delay before Inspection Stops lower.
       INSPECT                                                                                            INSPECT
       DELAY                                                                                              STOP DEL
0097  |-------] [----------------------------------------------------------------------------------      ------(TIM   )
            T002                                                                                             [  T003]
                                                                                                             [- #0010]

Lowers Inspection Stops.
       INSPECT                                                                                            INSP. EXT
       STOP DEL                                                                                           STOPS
0099  |-------] [----------------------------------------------------------------------------------      ---------------( )
            T003                                                                                                00305
```

-continued
PROGRAM LISTING
APPENDIX A

Filename:           ais        Ladder Diagram Printout         Line    245       Page       6
May 21, 1991                                                                     10:23 am

```
       Retracts Inspection Position Cylinder to register plate.
       INSPECT    SAMPLE                                                    INSP.
       STOP DEL   DURATION                                                  POS. CYL
0101   ---] [----------]/[--------------------------------------------------------( )
         T003        T007                                                      00302

Extends register pin on trailing edge.
       MANDREL    SAMPLE                                                    REG. PIN
       CLOSED RS  DURATION                                                  CYLINDER
0104   ---] [---+--------]/[-------------------------------------------------------( )
         00012  |    T007                                                      00303
       REG. PIN |
       CYLINDER |
       ---] [---+
         00303

Delay before Vacuum Generator comes on.
       INSPECT    REG. PIN   MANDREL                                        VACUUM
       STOP DEL   CYLINDER   OPEN RS                                        DELAY
0108   ---] [-----] [-----+-------]/[---------------------------------------(TIM   )
         T003      00303  |   00013                                          [ T004]
       VACUUM            |                                                   [ #0005]
       DELAY             |
       ---] [------------+
         T004

Vacuum Generator to hold plate.
       VACUUM                                                               VACUUM
       DELAY                                                                GENERATOR
0113   ---] [----------------------------------------------------------------------( )
         T004                                                                  00304

Delay to insure plate is registered before triggering.
       VACUUM     SAMPLE                                                    TRIGGER
       DELAY      DURATION                                                  DELAY
0115   ---] [---+--------]/[-------------------------------------------------(TIM   )
         T004   |    T007                                                     [ T005]
       TRIGGER  |                                                             [ #0010]
       DELAY    |
       ---] [---+
         T005
```

Filename            ais        Ladder Diagram Printout         Line    295       Page       7
May 21, 1991                                                                     10:23 am

```
       Triggers Vision System to check plate.
       TRIGGER    TRIGGER                                                   SAMPLE
       DELAY      DURATION                                                  IMAGE
0019   ---] [----------]/[--------------------------------------------------------( )
         T005        T006                                                      00101

Duration of trigger to Vision System.
       TRIGGER                                                              TRIGGER
       DELAY                                                                DURATION
0122   ---] [----------------------------------------------------------------------( )
         T005                                                                (TIM   )
                                                                             [ T006]
                                                                             [ #0005]

Sample duration.
       TRIGGER    RESET                                                     SAMPLE
       DURATION   INSP MODE                                                 DURATION
0124   ---] [---+--------]/[-------------------------------------------------------( )
         T006   |    01006                                                   (TIM   )
       SAMPLE   |                                                            [ T007]
       DURATION |                                                            [ #0020]
       ---] [---+
         T007
```

-continued
PROGRAM LISTING
APPENDIX A

```
       Verifies plate is in tolerance.
       VISION      STACKER                                                              EXIT FOR.
       ACCEPT      DELAY                                                                CONV. M5
0128   ---] [---+------]/[----------------------------------------------------------------- ( )
         00200  |   T008                                                                  00108
                |
       EXIT FOR.|
       CONV. M5 |
       ---] [---+
         00108

Verifies plate is out of tolerance.
       VISION      STACKER                                                              EXIT REV.
       REJECT      DELAY                                                                CONV. M5
0132   ---] [---+------]/[----------------------------------------------------------------- ( )
         00201  |   T008                                                                  00109
                |
       EXIT REV.|
       CONV. M5 |
       ---] [---+
         00109
```

Filename             ais          Ladder Diagram Printout          Line      345          Page       8
May 21, 1991                                                                                  10:23 am

```
       Resets Inspection Cycle and start Exit Cycle.
       SAMPLE      INSP.        EXIT                                                    RESET
       DURATION    EXIT PS      STA. PS                                                 INSP MODE
0136   ---] [---------]/[-----+------] [-------------------------------------------------- ( )
         T007         00011   |  00014                                                    01006
                              |
       RESET                  |
       INSP MODE              |
       ---] [-----------------+
         01006

Relay for Exit Rollers.
       PROCESS     EXIT CVR                                                             EXIT
       MODE        INTERLOCK                                                            ROLLER M4
0141   ---] [---------] [-------------------------------------------------------------- ( )
         01001       00004                                                                00107

Lowers Exit Rollers
       EXIT        EXIT         STACKER                                                 EXIT
       STA. PS     ROLLER M4    DELAY                                                   LIFT CYL
0144   ---] [---------] [-----+------]/[----------------------------------------------- ( )
         00014       00107   |   T008                                                     00306
                             |
       EXIT                  |
       LIFT CYL              |
       ---] [----------------+
         00306

Delay to allow plate to exit to stacker.
       PROCESS     EXIT         EXIT                                                    STACKER
       MODE        LIFT CYL     STA. PS                                                 DELAY
0149   ---] [---------] [----------]/[-------------------------------------------------- ( )
         01001       00306        00014                                                  (TIM  )
                                                                                         [ T008]
                                                                                         [ #0030]

0153   ------------------------------------------------------------------------------- [FUN 03]
                                                                                        [  ILC]

0154   ------------------------------------------------------------------------------- [FUN 01]
                                                                                        [ END]
```

What is claimed is:

1. A method of automatically inspecting an exposed and bent lithographic plate having an image thereon to determine whether the image is in proper registration relative to the plate, the plate having front, rear, and opposite side edges, said method comprising, automatically conveying a lithographic plate from bending apparatus to an inspection station, the plate having been bent by the bending apparatus to form flanges along the front and rear edges of the plate to enable mounting of the plate on a press, moving the lithographic plate into a fixed reference position at the inspection station and holding the plate in said position, automatically inspecting the plate when it is in said fixed reference position to determine whether said image is in proper registration relative to the plate, automatically conveying the plate from the inspection station to a first destination if the image is not in proper registration relative to the plate and to a second destination if the image is in proper registration relative to the plate.

2. A method as set forth in claim 1 wherein the image on each lithographic plate includes at least one registration mark, said automatic inspection of the plate being effected by electronic inspection means operable to optically inspect a plate in said fixed reference position and to compare the position of said registration mark to a master reference in electronic memory indicative of the proper registration of the image on the plate.

3. A method as set forth in claim 2 wherein a plate is automatically conveyed from the inspection station to a sorting conveyor, said method further comprising automatically conveying the plate in one direction on said sorting conveyor for delivery to said first destination if the image on the plate is not in proper registration and in opposite direction on said sorting conveyor for delivery to said second destination if the image on the plate is in proper registration.

4. A method as set forth in claim 2 adapted for handling black and white lithographic plates and color lithographic plates exiting the bending station, said method comprising automatically conveying only color plates to said inspection station, and automatically conveying black and white plates to storage means.

5. A method as set forth in claim 4 wherein plates conveyed from said bending apparatus are adapted to travel along a first path terminating at said storage means, said method further comprising allowing plates with black and white images thereon to be conveyed to said storage means, but stopping plates with color images thereon before they reach said storage means and conveying them along a second path to said inspection station.

6. A method as set forth in claim 5 wherein a plate is held in said fixed position at the inspection station by clamping said front and rear flanges of the plate in fixed position.

7. A method as set forth in claim 6 further comprising vacuum gripping the underside of the plate when the plate is in said fixed reference position.

8. A method as set forth in claim 6 wherein plates are conveyed along said first path with the front and rear flanges of the plates generally at right angles to the direction of conveyance, and the plates are conveyed along said second path with the front and rear flanges of the plate generally parallel to the direction of conveyance.

9. A method as set forth in claim 6 wherein the image on each lithographic plate includes two registration marks, said automatic inspection of the plate being effected by electronic inspection means operable to optically inspect a plate held in said fixed reference position and to compare the position of said registration marks to a master reference in electronic memory indicative of the proper registration of the image on the plate.

10. A method as set forth in claim 1 further comprising conveying the plate to a preliminary position at said inspection station, moving the plate in a direction generally parallel to said its side edges to said fixed reference position, and holding the plate in said fixed reference position by clamping the front and rear flanges of the plate.

11. Apparatus as set forth in claim 1 wherein a plate is held in said fixed reference position at the inspection station by clamping the front and rear flanges of the plate in fixed position.

12. Apparatus for automatically inspecting an exposed and bent lithographic plate having an image thereon to determine whether the image is in proper registration relative to the plate, the plate having front, rear, and opposite side edges, said apparatus comprising, first conveyor means for automatically conveying a lithographic plate from bending apparatus to an inspection station, the plate having been bent by the bending apparatus to form flanges along the front and rear edges of the plate to enable mounting of the plate on a press, positioning means at the inspection station for moving the lithographic plate into a fixed reference position and for holding the plate in said position, inspection means for automatically inspecting the plate when it is in said fixed reference position thereby to determine whether said image is in proper registration relative to the plate, second conveyor means for automatically conveying the plate from the inspection station to a first destination if the image is not in proper registration relative to the plate and to a second destination of the image is in proper registration relative to the plate.

13. Apparatus as set forth in claim 12 wherein said first conveyor means comprises an entry conveyor having an upstream end adjacent the bending apparatus for receiving plates exiting therefrom, and a downstream end, and a transfer conveyor for conveying a plate to be inspected from said entry conveyor to said inspection station.

14. Apparatus as set forth in claim 12 wherein said entry conveyor is adapted to convey plates with the front and rear edges of the plates extending generally at right angles to the direction of conveyance, and said transfer conveyor is adapted to convey plates with the front and rear edges of the plates extending generally parallel to the direction of conveyance.

15. Apparatus as set forth in claim 13 adapted for handling black and white lithographic plates and color lithographic plates, said apparatus further comprising infeed conveyor stop means movable between a stopping position for stopping a color plate on said entry conveyor system for conveyance to the inspection station by said transfer conveyor, and a non-stopping position for allowing a black and white plate to be conveyed to storage means associated with said apparatus.

16. Apparatus as set forth in claim 15 adapted for handling single-wide plates and double-wide plates conveyed from the bending apparatus, said entry conveyor being adapted for conveying two single-wide plates side-by-side simultaneously or one double-wide plate, and detector means for detecting a double-wide plate on said infeed conveyor, said entry conveyor stop means being responsive to a signal from said detector means to permit said double-wide plate to be conveyed to said storage means.

17. Apparatus as set forth in claim 12 further comprising inspection entry stop means adjacent said inspection station for preventing a plate from entering said inspection station until the preceding plate has been conveyed from the station.

18. Apparatus as set forth in claim 12 wherein each plate is adapted to travel through the inspection station with the front and rear flanges of the plate generally parallel to the direction of travel, said positioning means comprising a first pair of jaws at the inspection station, a second pair of jaws at the inspection station spaced from the first pair of jaws in a direction generally transverse to the direction of plate travel through the inspection station, and jaw-operating means for moving the two jaws of each pair of jaws from an open position to a closed position thereby to clamp the front and rear flanges of a plate at the inspection station between respective jaws and thus hold the plate in said fixed reference position.

19. Apparatus as set forth in claim 18 wherein said positioning means is operable for moving a plate to a preliminary position at the inspection station in which the front and rear flanges of the plate are disposed between respective jaws of the first and second pairs of jaws, the jaws and the jaw-operating means being so arranged and operable that closure of the jaws is adapted to move the plate in a direction generally transverse to the direction of plate travel to said fixed reference position in which the two jaws of the first and second pairs of jaws are in clamping engagement with respective front and back flanges of the plate.

20. Apparatus as set forth in claim 18 wherein the jaws of the first and second pairs of jaws have clamping surfaces configured to match the configurations of the front and rear flanges of the plate.

21. Apparatus as set forth in claim 18 further comprising a first registration pin projecting from one jaw of the first pair of jaws for reception in a first registration opening in the front flange of the plate when the jaws of the first pair of jaws close, and a second registration pin mounted on one jaw of the second pair of jaws for reception in a second registration opening in the rear flange of the plate when the jaws of the second pair of jaws close.

22. Apparatus as set forth in claim 18 wherein said jaw-operating means is operable to open the jaws in response to a signal indicating that the inspection of the plate is finished.

23. Apparatus as set forth in claim 19 wherein said positioning means further comprises a vacuum table located between said first and second pairs of jaws at the inspection station and movable with the jaws as the jaws open and close in a direction generally transverse to the direction of plate travel through the inspection station, said vacuum table being operable to vacuum grip a plate when the jaws are closed and being movable with the jaws as they open to ensure that the plate, vacuum gripped to the table, moves from its fixed reference position back to its said preliminary position preparatory to conveyance from the conveyor.

24. Apparatus as set forth in claim 19 wherein said positioning means further comprises an inspection station conveyor adapted to accept a plate from said first conveyor means and to convey it toward said preliminary position, and inspection station stop means for stopping the plate on said conveyor at said preliminary position.

25. Apparatus as set forth in claim 24 wherein said inspection station conveyor comprises endless belt means having an upper generally horizontal reach, and lifter means movable between a raised position for lifting the upper reach of the endless belt means for accepting a plate from said first conveyor means and conveying it to said preliminary position, and a lowered position for lowering the upper reach of the endless belt means to deposit the plate on a support surface supporting the plate with its front and rear flanges generally between respective jaws of said first and second pairs of jaws.

26. Apparatus as set forth in claim 12 wherein the image on each lithographic plate includes two registration marks on the plate, said inspection means comprising two cameras mounted adjacent the inspection station for optically inspecting a plate held in said fixed reference position, said inspection means being operable to compare the position of said registration marks to a master reference in electronic memory indicative of the proper registration of the image on the plate.

27. Apparatus as set forth in claim 12 wherein said second conveyor means comprises a sorting conveyor for receiving plates conveyed from said inspection station, said sorting conveyor being operable to convey a plate to said first destination if the image on the plate is not in proper registration, and to said second destination if the image on the plate is in proper registration.

28. Apparatus as set forth in claim 27 wherein said first destination is a bin at one end of the sorting conveyor and said second destination is a bin at the opposite end of the sorting conveyor.

29. Apparatus as set forth in claim 27 wherein said sorting conveyor is an endless conveyor, and wherein said means for operating the sorting conveyor comprising a reversible motor responsive to a signal from said inspection means to run in either forward or reverse direction.

* * * * *